(12) United States Patent
Nitta et al.

(10) Patent No.: US 8,344,454 B2
(45) Date of Patent: Jan. 1, 2013

(54) SEMICONDUCTOR DEVICE

(75) Inventors: Kyoya Nitta, Kanagawa (JP); Yutaka Hoshino, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 107 days.

(21) Appl. No.: 13/048,926

(22) Filed: Mar. 16, 2011

(65) Prior Publication Data
US 2011/0248344 A1 Oct. 13, 2011

(30) Foreign Application Priority Data

Apr. 9, 2010 (JP) ................... 2010-090752

(51) Int. Cl.
*H01L 27/12* (2006.01)
(52) U.S. Cl. ............ 257/347; 257/66; 257/E27.112; 257/E29.003; 257/E21.7; 438/151; 438/154; 438/149
(58) Field of Classification Search .......... 257/347, 257/E27.112, 66, E29.003, E21.7; 438/151, 438/154, 149
See application file for complete search history.

(56) References Cited

U.S. PATENT DOCUMENTS
7,504,291 B2 3/2009 Maeda et al.
7,679,138 B2 3/2010 Tsujiuchi
2008/0017924 A1 1/2008 Matsumoto et al.
2010/0314686 A1 12/2010 Hirano
2011/0140203 A1* 6/2011 Hou et al. .............. 257/401

FOREIGN PATENT DOCUMENTS
| JP | 2003-318405 A | 11/2003 |
| JP | 2007-287718 A | 11/2007 |
| JP | 2007-287747 A | 11/2007 |
| JP | 2007-288554 A | 11/2007 |
| JP | 2008-172262 A | 7/2008 |

* cited by examiner

*Primary Examiner* — Cuong Q Nguyen
*Assistant Examiner* — Cathy N Lam
(74) *Attorney, Agent, or Firm* — Mattingly & Malur, PC

(57) ABSTRACT

An object of the invention is to provide a semiconductor device having improved performance, high reliability, and a reduced chip size, in particular, to provide a semiconductor device having an MOSFET over an SOI substrate capable of maintaining its reliability while controlling the potential of a well below a gate electrode and preventing generation of parasitic capacitance. Generation of parasitic capacitance is prevented by controlling the potential of a well below a gate electrode by using a well contact plug passing through a hole portion formed in a gate electrode wiring. Generation of defects in a gate insulating film is prevented by making use of a gettering effect produced by causing an element isolation region to extend along the gate electrode.

15 Claims, 29 Drawing Sheets

2: GATE ELECTRODE
3: GATE ELECTRODE WIRING
4: ELEMENT ISOLATON REGION
8: WELL CONTACT PLUG
27: HOLE PORTION

SEMICONDUCTOR DEVICE

CROSS-REFERENCE TO RELATED APPLICATIONS

The disclosure of Japanese Patent Application No. 2010-90752 filed on Apr. 9, 2010 including the specification, drawings and abstract is incorporated herein by reference in its entirety.

BACKGROUND

The present invention relates to a semiconductor device, particularly to a technology effective when applied to a semiconductor device using SOI (silicon on insulator) substrate.

As a semiconductor device capable of suppressing generation of parasitic capacitance, semiconductor devices having, for example, an SOI substrate are used currently. The SOI substrate is a semiconductor substrate having a BOX (buried oxide) film (embedded oxide film) formed over a support substrate made of, for example, high-resistance Si (silicon) and, on the BOX film, a thin layer (silicon layer) composed mainly of Si (silicon). Generation of parasitic capacitance in a diffusion region formed in the silicon layer can be reduced by forming an MOSFET (metal oxide semiconductor field effect transistor) over the SOI substrate. A semiconductor device manufactured using the SOI substrate is therefore expected to have an improved integration density and an improved operation speed and be latchup free.

Patent Document 1 (Japanese Patent Laid-Open No. 2007-288554) discloses, in a switched capacitor circuit formed over an SOI substrate and having a differential structure, a technology of reducing a leakage current, upon switch off, of a transistor used for a switch to be coupled at one end thereof to an analog ground which is at an intermediate potential between Vss and Vdd. According to the technology disclosed in Patent Document 1, it is possible to realize a source-tie transistor having a potential of a channel region fixed using a coupling member formed outside agate end portion.

Patent Document 2 (Japanese Patent Laid-Open No. 2003-318405) discloses, in a device using an SOI substrate, a technology of forming a body (well) contact portion in the vicinity of the end portion of a gate electrode in a gate electrode width direction to fix the potential of a channel region and thereby realizing a high-speed and stable operation.

Patent Document 3 (Japanese Patent Laid-Open No. 2007-287718) discloses, in a semiconductor device using an SOI substrate, a technology of fixing the potential of a body region formed in a silicon layer over a BOX film with a view to reducing the parasitic capacitance of an MOSFET formed over the SOI substrate. According to this technology, a semiconductor region (heavily-doped region) of a first conductivity type is formed by introducing an impurity of the first conductivity type at a high concentration into a continuous region from a portion of the first conductivity type body (well) region below a gate electrode extending over the SOI substrate along the main surface of the SOI substrate to a portion of source and drain regions of a second conductivity type formed in the silicon layer to sandwich therebetween the body region in a gate length direction. This means that the body region and the source region formed in the silicon layer below a gate electrode of an MOSFET having the gate electrode and source and drain regions are electrically coupled to each other via the low-resistance heavily-doped region of the first conductivity type. In addition, the potential of the body region is also controlled in the vicinity of the end portion of the gate electrode in the gate width direction. A portion of this heavily-doped region is formed in a portion of the source region in the plane of the SOI substrate and the other portion of the source region having no heavily-doped region therein configures the MOSFET together with the drain region and the gate electrode. According to the technology disclosed in Patent Document 3, the potential of the body region can be fixed via the heavily-doped region and a region in the vicinity of the end portion of the gate electrode. Incidentally, the source region and the body region are electrically coupled to each other via a silicide layer formed over the heavily-doped region and the source region so that they have the same potential.

Patent Document 4 (Japanese Patent Laid-Open No. 2007-287747) discloses, in a semiconductor device using an SOI substrate, a technology of fixing the potential of a body region formed in a silicon layer over a BOX film with a view to reducing the parasitic capacitance of an MOSFET formed over the SOI substrate. According to this technology, the potential of the body region is fixed via a semiconductor region of a first conductivity type formed in the vicinity of the end portion of a gate electrode in the gate width direction of the MOSFET and electrically coupled to a body (well) region of the first conductivity type. This document also discloses a technology of forming a coupling region of the first conductivity type continuously from a portion of a second conductivity type source region of the MOSFET to the body region and fixing the potential of the body region via the coupling region and the source region. Incidentally, the source region and the body region are electrically coupled to each other via a silicide layer formed over the coupling region and the source region so that they have the same potential.

Patent Document 5 (Japanese Patent Laid-Open No. 2008-172262) discloses, in a semiconductor device using an SOI substrate, a technology of fixing the potential of a body region formed in a silicon layer over a BOX film with a view to reducing the parasitic capacitance in an MOSFET formed over the SOI substrate. According to this technology, the potential of the body region is fixed via a low-resistance semiconductor region of a first conductivity type formed in the vicinity of an end portion of a gate electrode in a gate width direction of the MOSFET and electrically coupled to a body (well) region of the first conductivity type. This document also discloses a technology of forming a coupling region of the first conductivity type continuously from a portion of a second conductivity type source region of the MOSFET to the body region and fixing the potential of the body region via the coupling region and the source region. Incidentally, there is also disclosed a technology of forming a portion of the gate electrode on the top surface of the SOI substrate at the interface of the coupling region and the source region in order to prevent the source region and the body region from having the same potential due to their electrical coupling via a silicide layer formed over the coupling region and the source region.

[Patent Document 1] Japanese Patent Laid-Open No. 2007-288554
[Patent Document 2] Japanese Patent Laid-Open No. 2003-318405
[Patent Document 3] Japanese Patent Laid-Open No. 2007-287718
[Patent Document 4] Japanese Patent Laid-Open No. 2007-287747
[Patent Document 5] Japanese Patent Laid-Open No. 2008-172262

SUMMARY

According to the technologies disclosed in Patent Documents 3 to 5, in the case of, for example, an n channel MOS- FET, a heavily-doped region is formed by implanting p type impurity ions (for example, B (boron)) at a high concentration into a continuous region starting from a p⁻ well (body region) to an n⁺ source region each formed in the main surface of the SOI substrate below the gate electrode. In this case, since high-concentration p type impurity ions (for example, B (boron)) are implanted also in the n type source region implanted with high-concentration impurities (for example, As (arsenic)), a region implanted with both n and p type impurities at a high concentration is formed in the source region. Crystal defects tend to appear in such a region where both the n type and p type impurities are present at a high concentration. There is a fear of the crystal defects transferring (diffusing) to another region and causing defects in a gate insulating film below the gate electrode. Many pores appear in the gate insulating film with the defects. Due to conduction between the gate electrode and the p⁻ well through these pores, a leakage current occurs between the gate electrode and the p⁻ well. Accordingly, occurrence of the defects in the gate insulating film leads to deterioration in the reliability of the gate insulating film.

According to the technologies disclosed in Patent Documents 3 and 4, for example, in the case of an n channel MOSFET, the potential of the p⁻ well is controlled by coupling the n⁺ type source region to the p⁻ well in a heavily-doped continuous p⁺ type region. According to these technologies, however, the p⁻ well and the n⁺ type source region are electrically coupled to each other via a silicide layer formed over the p⁻ well and the n⁺ type source region, which prevents independent control of their potentials because they always have the same potential. This leads to a low degree of freedom in control of the respective potentials of the p⁻ well and the n⁺ type source region.

According to the technologies disclosed in Patent Documents 1 to 5, a semiconductor region having the same conductivity type as that of a body (well) region is formed in the vicinity of an end portion of a gate electrode in a gate width direction and the potential of the body region is controlled via the semiconductor region. This technology, however, needs a new region (space) for forming this semiconductor region over the SOI substrate, leading to an increase in the area of a semiconductor element.

An object of the invention is to provide a semiconductor device having improved performance.

Another object of the invention is to provide a semiconductor device having high reliability.

A further object of the invention is to provide a semiconductor device having a reduced chip size.

A still further object of the invention is to provide a semiconductor device satisfying the above objects simultaneously.

The above and other objects and novel features of the invention will become apparent from the description herein and accompanying drawings.

Typical embodiments, among the embodiments disclosed herein, will next be described briefly.

A semiconductor device which is one of preferred embodiments of the invention has a field effect transistor formed over the main surface of a semiconductor substrate having an SOI structure. The semiconductor device has a gate wiring which lies at right angles to a gate electrode extending along the main surface of the semiconductor substrate and formed in the same layer as the gate electrode and a coupling layer of a first conductivity type formed in a well region below the gate wiring in the plane of the semiconductor substrate, electrically coupled to the well region, and has lower resistance than the well region. The semiconductor device further has a first wiring formed above the gate electrode and the gate wiring and supplying a predetermined potential to the well region. The coupling layer and the first wiring are provided in a first hole portion formed in the gate wiring in a region overlapping with the coupling layer in the plane of the semiconductor substrate and they are electrically coupled to each other via a coupling member insulated from the gate wiring.

Advantages available from typical inventions, among those disclosed herein, will next be described briefly.

The invention makes it possible to provide a semiconductor device having improved performance.

In addition, the invention makes it possible to provide a semiconductor device having high reliability.

Further, the invention makes it possible to provide a semiconductor device having a reduced chip size.

Still further, the invention makes it possible to provide a semiconductor device capable of satisfying the above objects simultaneously.

DETAILED DESCRIPTION

Figure 1:
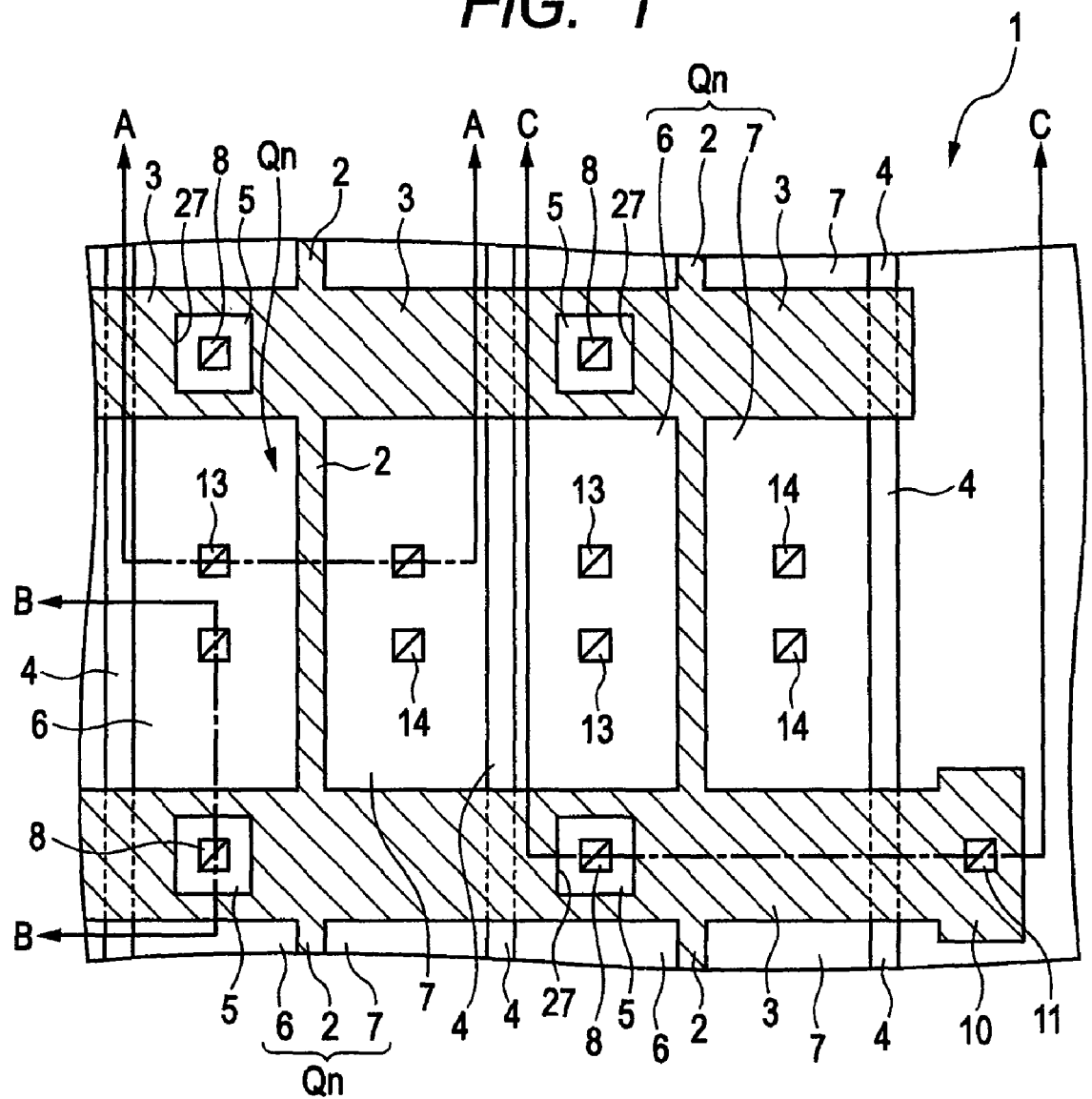
FIG. 1 is a planar layout of a semiconductor device according to First Embodiment of the invention.

In the embodiments described below, a description will be made after divided in plural sections or in plural embodiments if necessary for convenience's sake. These plural sections or embodiments are not independent of each other, but in a relation such that one is a modification example, details or complementary description of a part or whole of the other one unless otherwise specifically indicated.

In the embodiments described below, when a reference is made to the number of elements (including the number, value, amount and range), the number is not limited to a specific number but can be greater than or less than the specific number unless otherwise specifically indicated or principally apparent that the number is limited to the specific number.

Moreover in the embodiments described below, it is needless to say that the constituting elements (including element steps) are not always essential unless otherwise specifically indicated or principally apparent that they are essential. Similarly, with regard to any constituting element in the embodiments, the term "includes A", "composed of A", "made of A", or the like does not exclude another element unless otherwise specifically indicated or principally apparent from the context that it is not.

Similarly, in the embodiments described below, when a reference is made to the shape or positional relationship of the constituting elements, that being substantially analogous or similar to it is also embraced unless otherwise specifically indicated or principally apparent that it is not. This also applies to the above-described value and range.

When a reference is made to materials and the like, a specified material is a main material, but secondary factors, additives, additional factors and the like are not excluded. For example, the term "silicon member" includes not only a member made of pure silicon but also a member containing a binary or ternary alloy (for example, SiGe alloy) having an added impurity and silicon as main components unless otherwise specifically indicated.

Further, in all the drawings for describing the embodiments, like members of a function will be identified by like reference numerals and overlapping descriptions will be omitted.

Also, in drawings used in the following embodiments, hatching may be used partially even in a plan view so as to make the drawings easy to see.

First Embodiment

Figure 2:
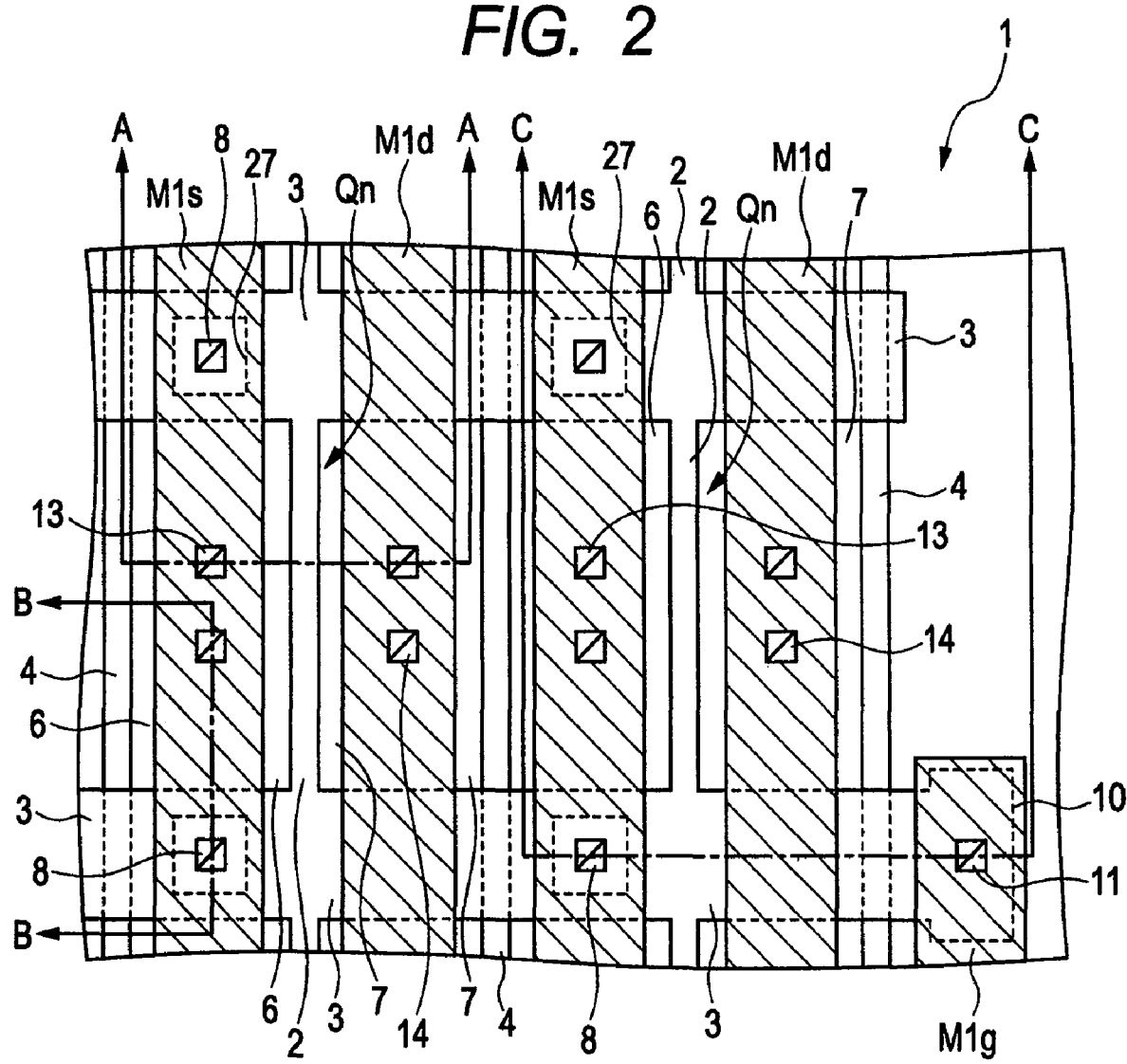
FIG. 2 is another planar layout of a semiconductor device according to First Embodiment of the invention.
Figure 3:
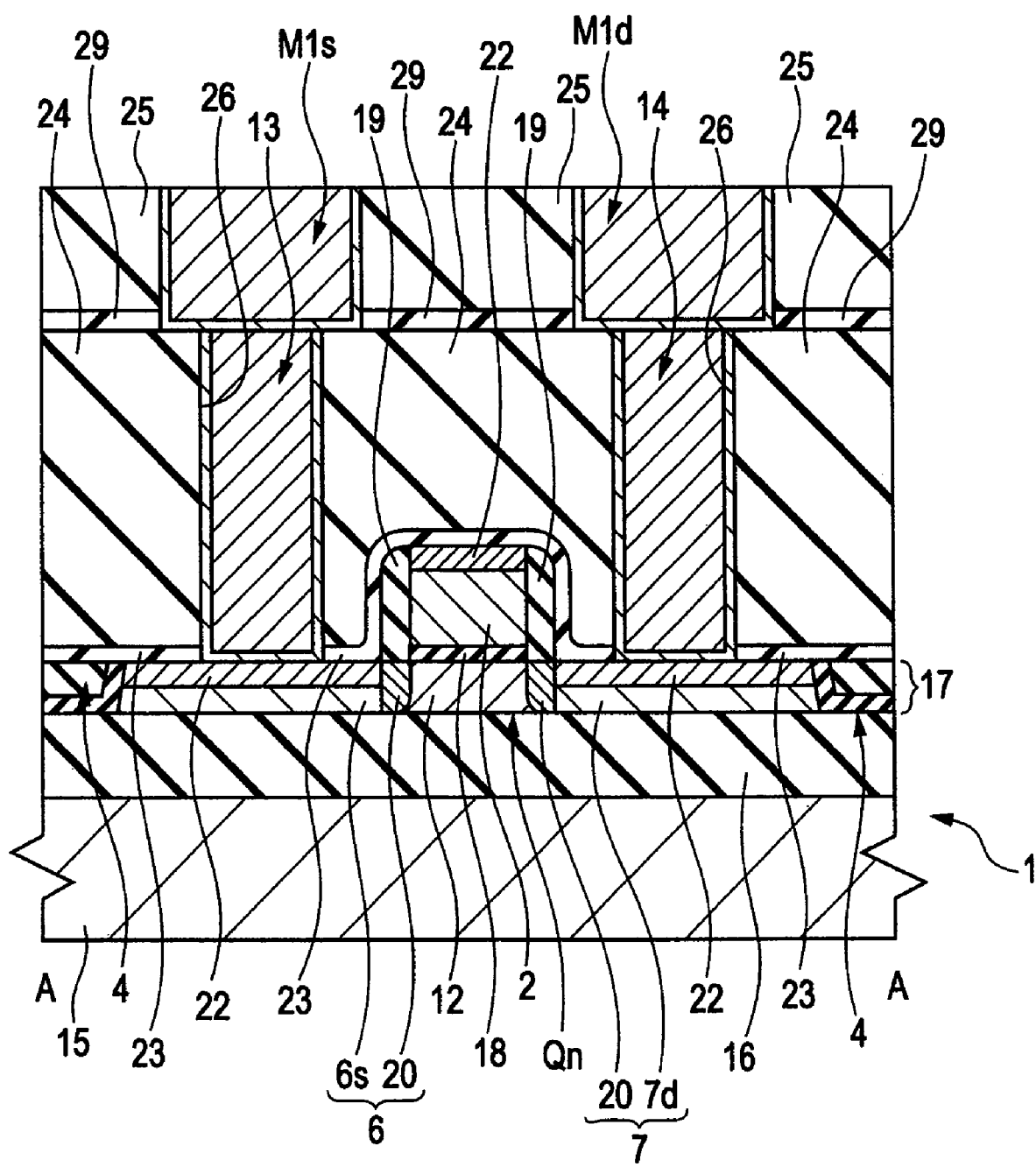
FIG. 3 is a fragmentary cross-sectional view taken along a line A-A of FIGS. 1 and 2.
Figure 4:
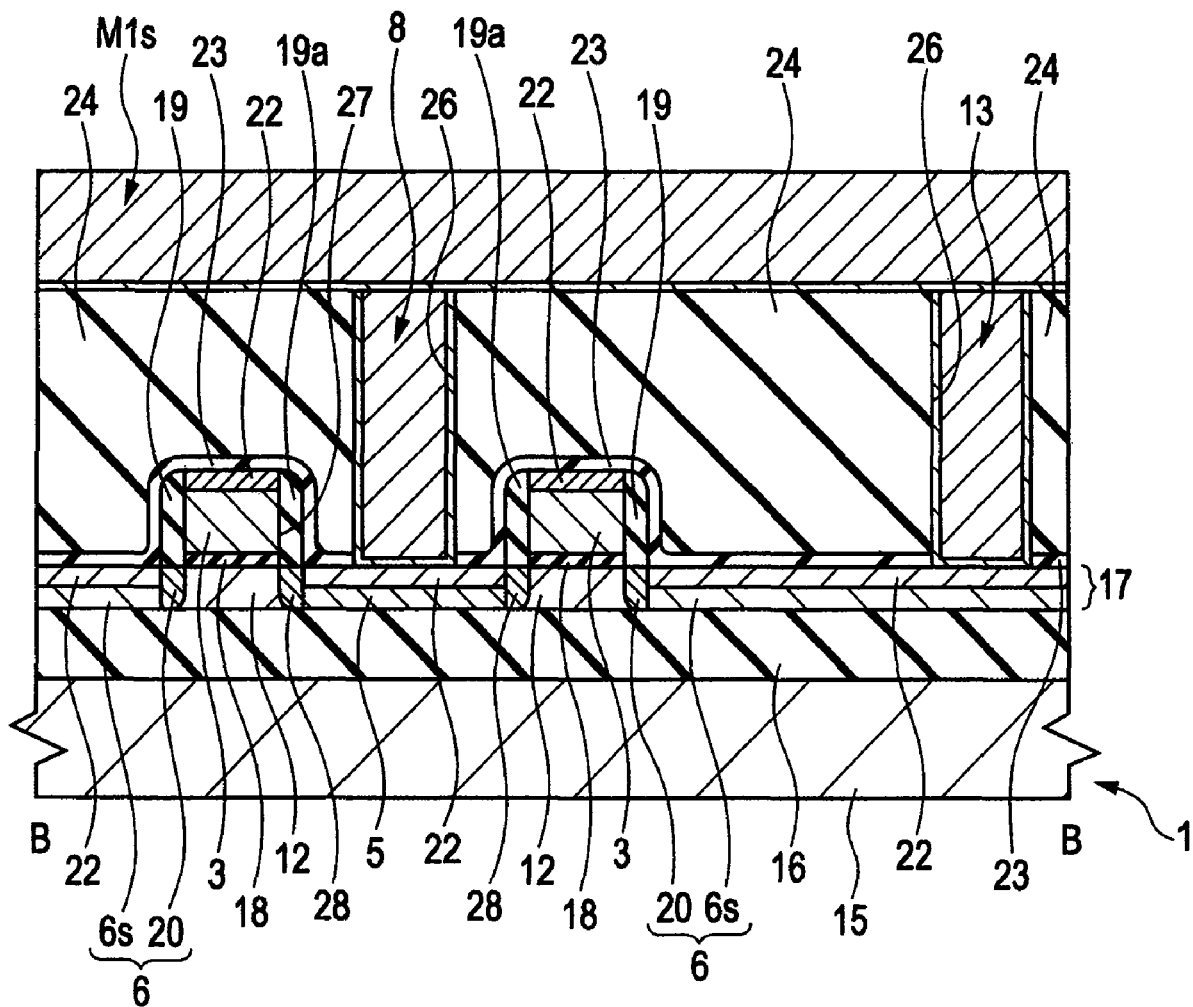
FIG. 4 is a fragmentary cross-sectional view taken along a line B-B of FIGS. 1 and 2.
Figure 5:
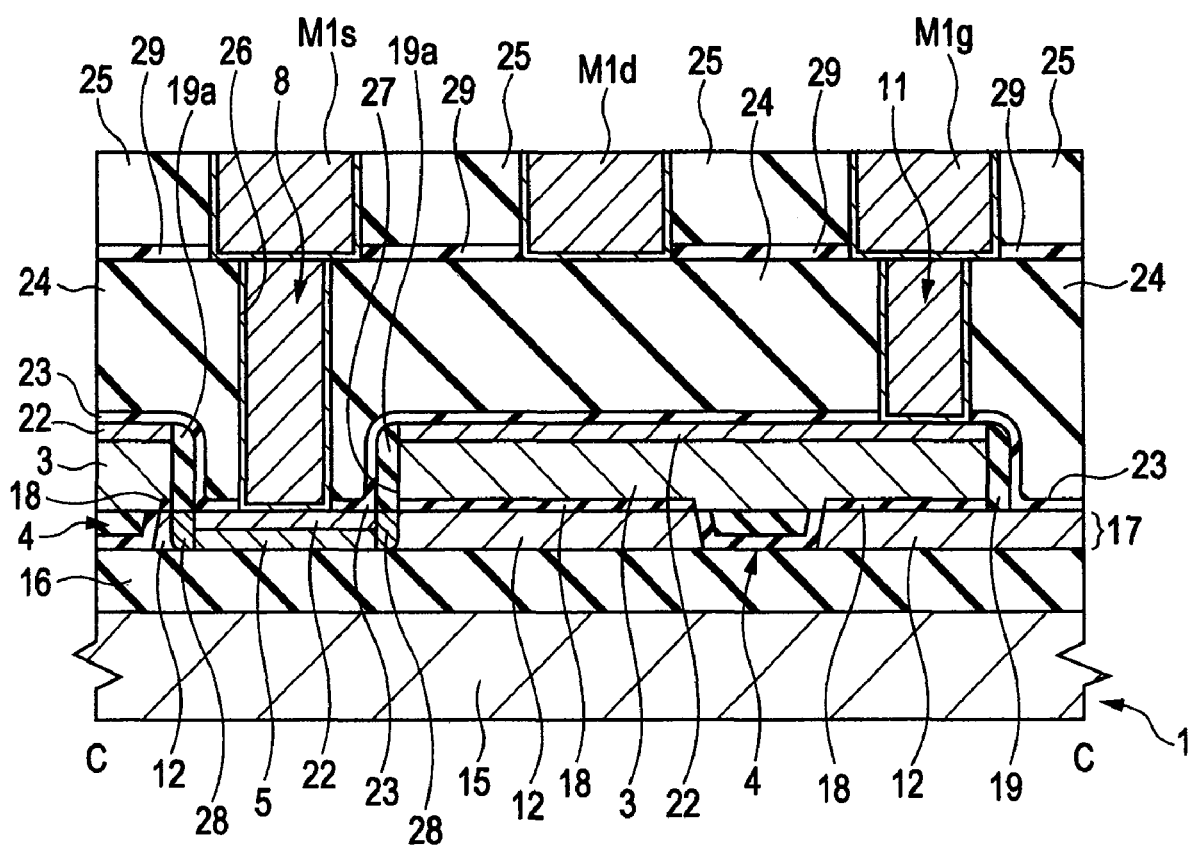
FIG. 5 is a fragmentary cross-sectional view taken along a line C-C of FIGS. 1 and 2.

On example of an n-channel MOSFET which is a field effect transistor according to First Embodiment of the invention will be described refer to FIGS. 1 to 5. FIGS. 1 and 2 are plan views (planar layouts) showing a portion of the layout of an n channel MOSFET formed over an SOI substrate. FIGS. 3 to 5 are fragmentary cross-sectional views taken along lines A-A, B-B, and C-C of FIGS. 1 and 2, respectively. Incidentally, FIGS. 1 and 2 are plan views showing the same region and the region is shown after divided in two planar layouts in order to facilitate understanding of a plurality of layers. Described specifically, FIG. 1 does not show metal wirings formed higher than the gate electrode 2 and FIG. 2 shows metal wirings (source wiring M1s, drain wiring M1d, and gate wiring M1g).

The SOI substrate over which the semiconductor device of the present embodiment has been formed is a semiconductor substrate having a BOX film formed on a high-resistance support substrate and a silicon layer formed on the BOX film. As illustrated in FIG. 1, the SOI substrate 1 has thereon a plurality of gate electrodes 2 extending in a first direction which is a direction along the main surface of the SOI substrate 1 and the gate electrodes 2 are coupled respectively to a plurality of gate electrode wirings 3 extending in a second direction which is along the main surface of the SOI substrate 1 and lies at right angles to the first direction. Some of the gate electrode wirings 3 in the second direction have at the end portion thereof a gate connection portion 10 and the gate connection portion 10 has thereon a gate contact plug 11. The gate electrode wiring 3 is an extraction wiring for feeding power to the gate electrode 2. The gate electrode 2, the gate electrode wiring 3, and the gate connection portion 10 are each made of a polysilicon film formed as the same layer and they are formed over the main surface of the SOI substrate 1 via a gate insulating film.

In other words, the plural gate electrodes 2 extend in the first direction and the plural gate electrode wirings 3 extend in the second direction so that the gate electrodes 2 and the gate electrode wirings 3 are together formed as a lattice (like a net) over the SOI substrate and the gate electrode 2, the gate electrode wiring 3, and the gate connection portion 10 are formed integrally. Incidentally, the gate electrode 2, the gate electrode wiring 3, and the gate connection portion 10 each has, on the side walls thereof, a sidewall made of an insulating film, which are, however, not illustrated in FIGS. 1 and 2.

The gate electrodes 2 are formed in a region between the plural gate electrode wirings 3; the gate electrodes 2 has, on the main surface of the SOI substrate 1 therebelow, a p⁻ well 12 (refer to FIG. 3) along the first direction; and over the main surface of the SOI substrate 1, a source region 6 and a drain region 7, which are heavily-doped n semiconductor regions, extend in the first direction so as to sandwich therebetween a p⁻ well 12. This means that the p⁻ well 12 formed over the main surface of the SOI substrate 1 below the gate electrode 2 and extending in the first direction has the source region 6 contiguous to one of the side surfaces of the well and the drain region 7 contiguous to the other side surface.

On the side walls of the source region 6 and the drain region 7 extending in the second direction and not contiguous to the p⁻ well 12, an element isolation region 4 extends on the upper surface of the SOI substrate 1 along the first direction. In other words, over the main surface of the SOI substrate 1, a plurality of element isolation regions 4 extending in the first direction in the plane of the SOI substrate 1 lie in parallel to the gate electrodes 2 and two element isolation regions 4 adjacent to each other have therebetween the source region 6 and the drain region 7 extending in the first direction. The source region 6 and the drain region 7 have therebetween the p⁻ well 12 (refer to FIG. 3) extending in the first direction. Incidentally, the source region 6 and the drain region 7 do not exist below the gate electrode wiring 3 and a plurality of the source regions or a plurality of drain regions are formed along the first direction with a space therebetween below the gate electrode wiring 3. As illustrated in FIG. 3, the p⁻ well 12 is formed over the main surface of the SOI substrate 1 below the gate electrode 2, but as illustrated in FIGS. 4 and 5, it is also formed over the main surface of the SOI substrate 1 below the gate electrode wiring 3. The p⁻ well 12 below the gate electrode 2 and the p⁻ well 12 below the gate electrode wiring 3 are formed continuously and integrally and they are electrically coupled to each other.

As illustrated in FIGS. 1 and 5, the element isolation region 4 extends in the first direction continuously and is not interrupted even below the gate electrode wiring 3. In the present embodiment, the element isolation region 4 is formed preferably by using a STI (shallow trench isolation) process not by a LOCOS (local oxidization of silicon) process. This means that the element isolation region 4 is formed by filling an insulating film such as silicon oxide film in a trench formed in a silicon layer 17 configuring a portion of the SOI substrate 1.

As illustrated in FIG. 2, metal wirings are formed over the gate electrode wiring 3 and the gate connection portion 10 over the SOI substrate 1. The gate connection portion 10 has thereover a gate wiring M1g; the source region 6 has thereover a source wiring M1s extending in the first direction; and the drain region 7 has thereover a drain wiring M1d extending in the first direction. The gate wiring M1g, the source wiring M1s, and the drain wiring M1d are each formed as the same layer. The bottom surface of the gate wiring M1g and the top surface of the gate connection portion 10 are electrically coupled to each other via a gate contact plug 11, the source wiring M1s and the source region 6 are electrically coupled to each other via the source contact plug 13, and the drain wiring M1d and the drain region 7 are electrically coupled to each other via a drain contact plug 14.

The gate electrode wiring 3 has a hole portion 27 which opens over the main surface of the SOI substrate 1 between the source regions 6 in the first direction and below the source wiring M1s. Due to this hole portion 27, the upper surface of a p⁺ extraction region 5 (refer to FIG. 1) which is a heavily-doped p type semiconductor region configuring a coupling layer of the p⁻ well 12 (refer to FIG. 3) formed over the main surface of the SOI substrate 1 is exposed from the gate electrode wiring 3. The hole portion 27 has therebelow a coupling layer planarly overlapping with the hole portion 27. The coupling layer is composed of a p type semiconductor region 28 and a p⁺ extraction region 5 which will be described later referring to FIG. 4 and it is a p type semiconductor region having lower resistance than the p⁻ well 12 (refer to FIG. 3). The top surface of the p⁺ extraction region 5 and the bottom surface of the source wiring M1s are electrically coupled to each other via a well contact plug 8 and the well contact plug 8 and the gate connection portion 10 are electrically insulated by an interlayer insulating film 24 (refer to FIG. 3) formed therebetween.

The gate electrode 2, the gate electrode wiring 3, the gate connection portion 10, the source region 6, the drain region 7, and the p⁺ extraction region 5 each has, over the top surface thereof, a silicide layer 22 (refer to FIG. 3). This means that the gate connection portion 10, the source region 6, the drain region 7, and the p⁺ extraction region 5 are electrically coupled to the gate contact plug 11, the source contact plug 13, the drain contact plug 14, and the well contact plug 8, respectively, via the silicide layer.

As illustrated in FIGS. 1 and 2, the SOI substrate 1 has thereover n channel MOSFETs Qn including the gate electrode 2, the source region 6, and the drain region 7 intermittently in the first direction and the second direction and thus, a plurality of the n channel MOSFETs Qn are arranged in a matrix form over the SOI substrate 1. Two n channel MOSFET Qn formed intermittently in the second direction have therebetween an element isolation region 4 having a first-direction length longer than a first-direction width of the gate electrode wiring 3, which separates these two n channel MOSFET Qn from each other.

As illustrated in FIG. 3 which is a fragmentary cross-sectional view taken along a line A-A along the first direction of FIGS. 1 and 2, the SOI substrate 1 is a semiconductor substrate having a BOX film 16 formed over a high-resistance support substrate 15 and a silicon layer 17 formed on the BOX film 16. The silicon layer 17 has thereover a gate electrode 2 formed via a gate insulating film 18. The gate electrode 2 and the gate insulating film 18 have, on the side walls thereof, sidewalls 19. The silicon layer 17 below the gate electrode 2 and the gate insulating film 18 has a p⁻ well 12 and the silicon layer 17 below each of the sidewalls 19 has an extension region 20 having an n type impurity (for example, As (arsenic)) introduced therein. With regard to the extension regions 20 below the sidewalls 19 formed on both of the side walls of the gate electrode 2, one of the side walls is contiguous to the p⁻ well 12 and the other side wall is contiguous to an n⁺ semiconductor region 6s or an n⁺ semiconductor region 7d. The n⁺ semiconductor regions 6s and 7d are regions obtained by introducing an n type impurity (for example, As (arsenic)) into the silicon layer 17 at a higher dose than the extension region 20. In the second region, one of the side walls of each of the n⁺ semiconductor regions 6s and 7d is contiguous to the extension region 20 and the other side wall is contiguous to the element isolation region 4. The extension region 20 and the n⁺ semiconductor regions 6s and 7d configure an LDD (lightly doped drain) structure. In this structure, the n⁺ semiconductor region 6s and the extension regions 20 contiguous to the n⁺ semiconductor region 6s configure the source region 6 functioning as a source of an n channel MOSFET Qn, while the n⁺ semiconductor region 7d and the extension region 20 contiguous to the n⁺ semiconductor region 7d configure the drain region 7 functioning as a drain of the n channel MOSFET Qn.

The gate electrode 2, the n⁺ semiconductor region 6s, and the semiconductor region 7d have, on the top surfaces thereof, a silicide layer 22; the SOI substrate 1 has thereover an insulating film 23 so as to cover the gate electrode 2; and the insulating film 23 has thereover an interlayer insulating film 24 thicker than the insulating film 23. The interlayer insulating film 24 has thereover a source wiring M1s and a drain wiring M1d, which are damascene wirings, and an interlayer insulating film 25. With a source contact plug 13 and a drain contact plug 14 formed in the contact hole 26 extending from the top surface of the interlayer insulating film 24 to the top surface of the silicide layer 22 over the semiconductor region 7d and the n+ semiconductor region 7d, the source wiring M1s is electrically coupled to the source region 6 and the drain wiring M1d is electrically coupled to the drain region 7.

In FIGS. 1, 2, and 3, the gate electrode 2, the gate electrode wiring 3, and the gate connection portion 10 are films made of polysilicon and the gate electrode 2 functions as a gate of an n channel MOSFET Qn in the present embodiment. The gate insulating film 18 is a silicon oxide film formed by thermal oxidation and it insulates the gate electrode 2, the gate electrode wiring 3, and the gate connection portion 10 from the SOI substrate 1. The p− well 12 is a region obtained by ion implantation, a low dose, of a p type impurity (for example, B (boron)) in the silicon layer 17 which is a thin layer over the SOI substrate 1 and is made of Si (silicon). It is electrically coupled to the p+ extraction region 5 obtained by ion implantation, at a higher dose than that in the p− well 12, of a p type impurity (for example, B (boron)) in the silicon layer 17. The sidewall 19 is made of a silicon oxide film and the silicide layer 22 is a layer containing, for example, NiSi (nickel silicide), a compound between Ni (nickel) and silicon. It may be a layer containing $CoSi_2$ (cobalt silicide) which is a compound between Co (cobalt) and silicon. With such a silicide layer 22, the source contact plug 13 and the drain contact plug 14 made of W (tungsten) or the like are electrically coupled to the source region 6 and the drain region 7, respectively. The silicide layer 22 is also formed over the gate electrode wiring 3 (refer to FIG. 4). The insulating film 23 is a thin film made of a silicon nitride film and functions as an etch stopper film upon opening of the contact hole 26. The interlayer insulating films 24 and 25 are thick films made of a silicon oxide film and formed, for example, by CVD (chemical vapor deposition). The source wiring M1s, the drain wiring M1d, and the gate wiring M1g are metal wirings composed mainly of copper for supplying a predetermined potential to the source region 6, the drain region 7, and the gate electrode 2, respectively. They are formed, for example, by the damascene process as the same layer.

As illustrated in FIG. 4 which is a fragmentary cross-sectional view taken along a line B-B along the first direction of FIGS. 1 and 2, the gate electrode wiring 3 formed over the SOI substrate 1 via the gate insulating film 18 has a hole portion 27 and the silicon layer 17 below the sidewall 19a formed contiguous to the side wall of the gate electrode wiring 3 contiguous to the hole portion 27 has a p type semiconductor region 28. The p type semiconductor region 28 is a semiconductor region obtained by ion implantation of a p type impurity (for example, B (boron)) of a low dose in the p− well 12 and it is in contact with the p+ extraction region 5 so as to sandwich it with the semiconductor region in the silicon layer 17 below the hole portion 27. This means that in the plane of the SOI substrate 1, the p type semiconductor region 28 surrounds the periphery of the p+ extraction region 5. The silicon layer 17 below the gate electrode wiring 3 has the p− well 12, which is electrically coupled to the p+ extraction region 5 via the p type semiconductor region 28. In other words, the coupling layer for the p− well 12 is made of the p+ extraction region 5, which has lower resistance than the p− well 12, and the p type semiconductor region 28, which has been formed between the p+ extraction region 5 and the p− well 12, has lower resistance than the p− well 12, and has higher resistance than the p+ extraction region 5. Incidentally, direct coupling of the low-resistance p+ extraction region 5 and high-resistance p− well 12 in the silicon layer 17 may presumably cause electric field dose on the interface between the p+ extraction region 5 and the p− well 12. In order to relax the electric field, the p type semiconductor region 28 which has higher resistance than the p+ extraction region 5 and lower resistance than the p well 12 is therefore formed between the p+ extraction region 5 and the p− well 12 in the present embodiment, thereby forming a structure similar to the LDD structure of the source region 6 and the drain region 7.

Similar to the source region 6 and the drain region 7 shown in FIG. 3, the p− well 12 has, in the silicon layer 17 below the sidewall 19 formed on the other side wall of the gate electrode wiring 3 having no hole portion 27, an extension region 20. In FIG. 4, the extension region 20 is, at one of the side walls thereof, contiguous to the p+ extraction region 5 and, at the other side wall, contiguous to the n+ semiconductor region 6s extending in the first direction.

The gate electrode wiring 3, the n+ semiconductor region 6s, and the p+ extraction region 5 have thereover the silicide layer 22; the SOI substrate 1 has thereover an insulating film 23 so as to cover therewith the gate electrode wiring 3; and the insulating film 23 has thereover a thick interlayer insulating film 24. The interlayer insulating film 24 and also the gate electrode wiring 3, the n+ semiconductor region 6s, the p+ extraction region 5, and the silicide layer 22 have thereover a source wiring M1s extending continuously in the first direction. The source wiring M1s is electrically coupled to the source region 6 via a source contact plug 13 in a contact hole 26 formed in the interlayer insulating film 24 and is also electrically coupled to the p+ extraction region 5 via a well contact plug 8 in the contact hole 26 formed in the interlayer insulating film 24. The well contact plug 8 penetrates through the hole portion 27 and is not contiguous to the gate electrode wiring 3 and is thus isolated therefrom. This means that the well contact plug 8 is formed in the hole portion 27 formed in the gate electrode wiring 3 and is not electrically coupled to the gate electrode wiring 3. The p− well 12 is, on the other hand, electrically coupled to the well contact plug 8 and the source wiring M1s via the p+ extraction region 5 and the p type semiconductor region 28 configuring a coupling layer of the p− well 12.

Incidentally, the n+ semiconductor region 6s obtained by ion implantation of an impurity (for example, As (arsenic)) at a high dose and the p+ extraction region 5 formed by ion implantation of a p type impurity (for example, B (boron)) at a high dose have therebetween the extension region 20, the p− well 12, and the p type semiconductor region 28 and are not in contact with the n+ semiconductor region 6s and the p+ extraction region 5. The n channel MOSFET Qn of the present embodiment therefore has no region where both an n type impurity (for example, As (arsenic)) and a p type impurity (for example, B (boron)) have been introduced at a high dose.

In the present embodiment, the p+ extraction region 5 and the source region 6 are electrically coupled to each other via a coupling layer made of the p+ extraction region 5 and the p type semiconductor region 28, the well contact plug 8, the source wiring M1s, and the source contact plug 13 so that they have always the same potential. In this embodiment, the p+ extraction region 5 and the source region 6 are not coupled to respective metal wirings but to the same wiring, that is, the source wiring M1s to reduce a wiring density and enhance the layout freedom of wiring.

In this embodiment, the n+ semiconductor region 6s and the n+ semiconductor region 7d are semiconductor regions implanted with an n type impurity at a dose of about $1\times10^{15}$ $cm^{-3}$, while the p+ extraction region 5 is a semiconductor region implanted with a p type impurity at a dose of about $1\times10^{15}$ $cm^{-3}$. The p+ extraction region 5 and the p type semiconductor region 28 are formed in the p− well 12 of a region overlapping with the gate electrode wiring 3 in the plane of the SOI substrate 1.

As illustrated in FIG. 5 which is a fragmentary cross-sectional view taken along a line C-C along the second direction of FIGS. 1 and 2, similar to FIG. 4, the gate electrode wiring 3 over the SOI substrate 1 has a hole portion 27 and a silicon layer 17 below the hole portion 27 has the p+ extraction region 5; the p+ extraction region 5 is electrically coupled to the source wiring M1s formed above the p+ extraction region 5 via the silicide layer 22 and the well contact plug 8. The well contact plug 8 penetrates through the hole portion 27 and is not in contact with the gate electrode wiring 3 and the gate connection portion 10 (not illustrated) and is therefore isolated therefrom. The gate electrode wiring 3 and the gate connection portion 10 are made of the same polysilicon film and they have thereon the silicide layer 22. The interlayer insulating film 24 formed over the SOI substrate as in FIGS. 3 and 4 has the source wiring M1s, the drain wiring M1d, and the gate wiring M1g which are damascene wiring and the gate wiring M1g is electrically coupled to the gate connection portion 10 via the contact plug 11 in the contact hole 26 formed in the interlayer insulating film 24. The silicon layer 17 below the gate electrode wiring 3 and the gate connection portion 10 has the p− well 12 and the element isolation region 4 isolating cells from each other extends in the first direction.

The advantage of the present embodiment will next be described using an n channel MOSFET shown in FIG. 29 as a comparative example.

A parasitic capacitance is a capacitance formed parasitically between elements, an element and a wiring, or an element and a grounding electrode. When an MOSFET is formed over a semiconductor substrate, a parasitic capacitance usually appears between a gate and a source, a source and a drain, or a gate and a drain. The parasitic capacitance also appears between a gate, source or drain, and a semiconductor substrate or a PN junction region at the interface between a well and a source/drain region.

In the case of a MOSFET for switching to be used in a high frequency circuit, deterioration in the amplitude of a signal because the parasitic capacitance becomes a burden has an adverse effect on the high-frequency characteristics or loses the stability of the circuit operation. Such deterioration in characteristics can be reduced by forming the MOSFET on an SOI substrate and thereby reducing the parasitic capacitance. The parasitic capacitance can be reduced further by fixing a substrate potential to control the potential of a well (substrate).

In the n channel MOSFET shown as a comparative example, p type impurities (for example, B (boron)) have been implanted at a high dose from a well which is a channel region to a source region in order to control the potential of a well (substrate). FIG. 29 is a planar layout of the n channel MOSFET used as a comparative example. In FIG. 29, sidewalls formed over the side walls of each of a gate electrode 2a and a gate connection portion 10a are not illustrated and a silicide layer, an interlayer insulating film, and wirings formed over each of the gate electrode 2a, the gate connection portion 10a, source region 6a, and a drain region 7a are not illustrated.

Figure 29:
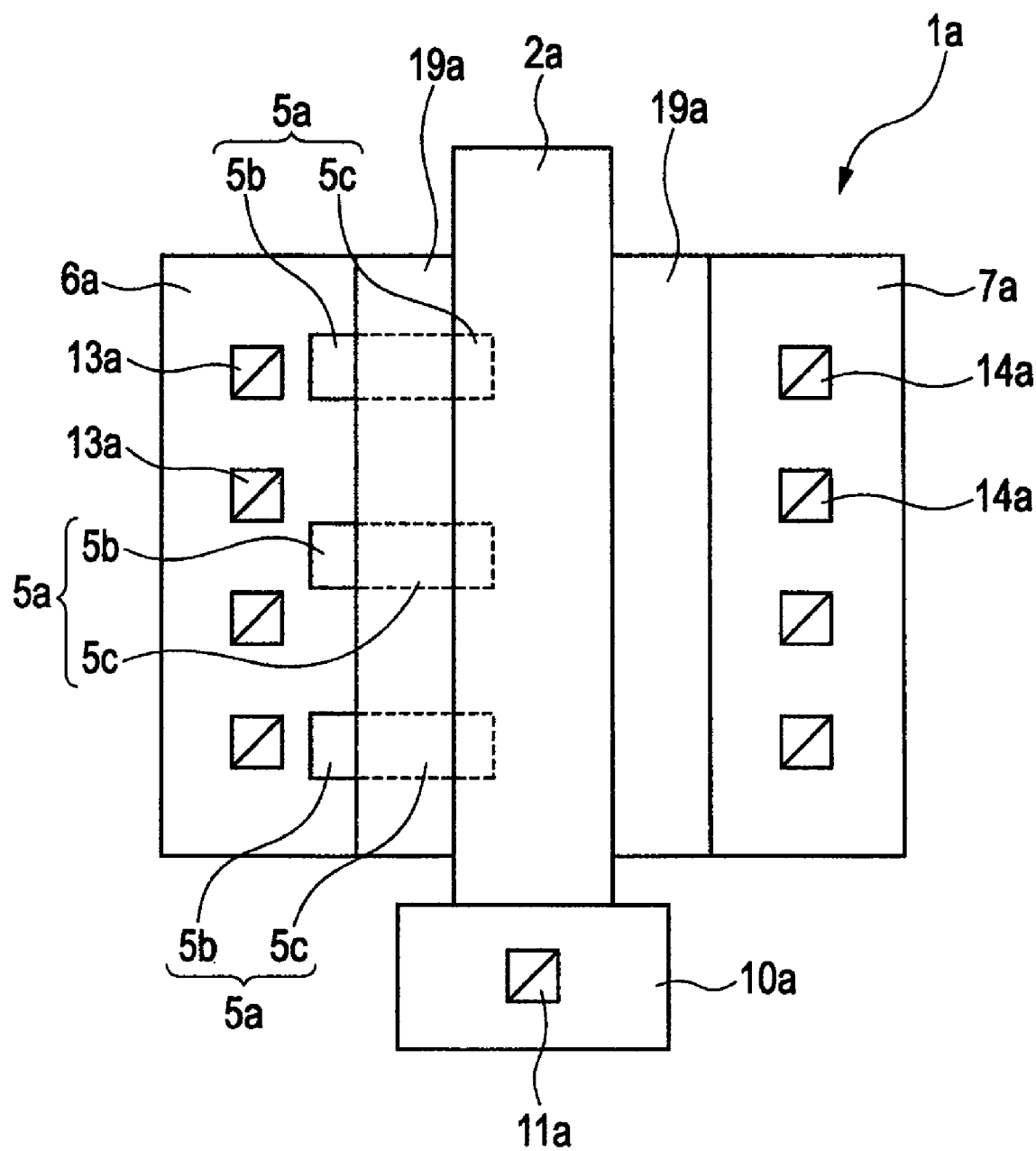
FIG. 29 is a planar layout of a semiconductor device shown as a comparative example.

As illustrated in FIG. 29, the SOI substrate 1a has thereover the gate electrode 2a extending in the first direction and the gate electrode 2a has, at an end portion thereof in the first direction, the gate connection portion 10a formed as the same layer as the gate electrode 2a. The gate connection portion 10a has thereover a gate contact plug 11a, by which a gate wiring (not illustrated) and the gate electrode 2a are electrically coupled to each other. The gate electrode 2a has therebelow a p− well (not illustrated) extending in the first direction and the p− well is sandwiched between the source region 6a and the drain region 7a in a direction which is along the main surface of the SOI substrate 1a and lies at right angles with the first direction. The source region 6a and the p− well and the drain region 7a and the p− well have therebetween extension regions (not illustrated) extending in the first direction, respectively. The source region 6a and the drain region 7a are semiconductor regions obtained by ion implantation of n type impurities (for example, As (arsenic)) at a high dose and extending along the first direction. The extension region (not illustrated) is a region in which n type impurities (for example, As (arsenic)) have been implanted at a lower dose than that of the source region 6a and the drain region 7a. The source region 6a and the drain region 7a have thereover a plurality of source contact plugs 13a and a plurality of drain contact plugs 14a formed intermittently along the first direction, by which a source wiring (not illustrated) and a drain wiring (not illustrated) formed over the source region 6a and the drain region 7a are electrically coupled to the source region 6a and the drain region 7a, respectively.

In the n channel MOSFET of the comparative example, p type impurities (for example, B (boron)) have been ion implanted at a high dose into the main surface of the semiconductor substrate from the p− well, which is a channel formation region of the n channel MOSFET between the source region 6a and the drain region 7a to an end portion of the source region 6a in order to attain the potential of the high resistance P− well. The p− well and the source region 6a implanted with the p type impurities (for example, B (boron)) at a high dose have thereon a p+ extraction region 5a and via this p+ extraction region 5a, the p− well is electrically coupled to the source region 6a. In this example, the source region 6a, the drain region 7a, and the p+ extraction region 5a are regions implanted with n type or p type impurities at a dose of about $1 \times 10^{15}$ cm$^{-3}$.

Incidentally, the p+ extraction region 5a is made of a p+ type region 5c formed over the p− well and an overstrike region 5b formed over the source region 6a. In the second direction, one of the end portions of the p+ extraction region 5a (the end portion of the p+ type region 5c) is in contact with the p− well and terminates below the gate electrode 2a, below the sidewall (not illustrated) formed on the side wall of the gate electrode 2a, or in the p− well of another region. In FIG. 29, the contour of the p+ extraction region 5a formed below the gate electrode 2a is shown with a broken line. Further, in the second direction, the other end portion of the p+ extraction region 5a reaches in the source region 6a which is a semiconductor region implanted with n type impurities (for example, As (arsenic)) at a high dose and as a result, the source region 6a has therein the overstrike region 5b, which is a region implanted with n type impurities (for example, As (arsenic)) and p type impurities (for example, B (boron)) each at a high dose of about $1 \times 10^{15}$ cm$^{-3}$.

In this case, crystal defects appear in the overstrike region 5b because the region is implanted with n type and p type impurities each at a high dose. These defects transfer onto the SOI substrate 1a and cause defects in a gate insulating film (not illustrated) formed between the gate electrode 2a and the SOI substrate 1a. The defects in the gate insulating film attributable to the transfer of crystal defects which have occurred in the overstrike region 5b create a number of pores in the gate insulating film or pores penetrating from the top surface to the bottom surface of the gate insulating film. In the semiconductor device shown as a comparative example, there is a fear of an MOSFET ceasing to function due to these pores which allow electric conduction between the gate electrode 2a and the silicon layer below the gate electrode 2a and cause a leakage current between the gate electrode 2a and the silicon layer. In short, as the comparative example shown in FIG. 29, when the p+ extraction region 5a is formed from the source region 6a to the p− well to control the potential of the p− well, crystal defects occur in the p+ extraction region 5a and the gate insulating film, which remarkably deteriorates the reliability of the gate insulating film.

In the present embodiment, by coupling the well contact plug penetrating through a hole portion 27 formed in the gate electrode wiring 3 and coupled to the source wiring M1s to the p+ extraction region 5 formed in the silicon layer 17 below the hole portion 27, the potential (substrate potential) of the well (p− well 12) of the n channel MOSFET Q electrically coupled to the p+ extraction region 5 can be controlled.

In this embodiment, a region implanted with p type impurities at a high dose such as the p+ extraction region 5 illustrated in FIG. 4 and a region implanted with n type impurities at a high dose such as the n+ semiconductor region 6s and the n+ semiconductor region 7d illustrated in FIG. 3 are formed in respective regions and there is no overstrike region 5b as illustrated in FIG. 29 showing a comparative example. This means that there is no region implanted, at a dose as high as about $1 \times 10^{15}$ cm$^{-3}$, with p type impurities (for example, B (boron)) which have been introduced into the p+ extraction region 5 and n type impurities (for example, As (arsenic)) which have been introduced into the source region 6. It is possible to prevent occurrence of a leakage current between the gate electrode 2 and the silicon layer 17 by preventing generation of crystal defects in the top surface of the SOI substrate 1 and the gate insulating film 18 illustrated in FIG. 3. Accordingly, in the semiconductor device of the present embodiment, it is possible to control the potential of the p− well 12 without impairing the reliability of the gate insulating film 18 and thereby reducing the parasitic capacitance of the n channel MOSFET Qn.

In this embodiment, an n channel MOSFET is used as an example, but the invention can be applied also to a p channel MOSFET or further to a CMOSFET (complementary MOSFET) having both an n channel MOSFET and a p channel MOSFET. When the invention is applied to a p channel MOSFET, by forming an n+ extraction region containing n type impurities at a high dose in a silicon layer below the hole portion which has been formed in the gate electrode wiring, the potential of the n− well is controlled through the well contact plug and the wiring coupled to the n+ extraction region.

In the present embodiment, the n+ semiconductor region 6s and the n+ semiconductor region 7d shown in FIG. 3 serve as a source and a drain, respectively, but the n+ semiconductor region 6s and the n+ semiconductor region 7d may be functioned as a drain and a source, respectively.

By forming the element isolation region 4, which extends in the first direction, continuously without interrupting it below the gate electrode wiring 3 as illustrated in FIG. 1, crystal defects which have appeared in the silicon layer 17 can be attracted to the element isolation region 4 due to a gettering effect of the element isolation region 4. This makes it possible to prevent transfer of the defects appearing in the source region 6 or the drain region 7 to the gate insulating film 18, thereby further improving the reliability of a semiconductor device. In other words, since the element isolation region 4 serves as a gettering site capable of attracting crystal defects, a gettering effect to attract crystal defects which have appeared in the silicon layer 17 is produced, making it possible to improve the crystallinity of the silicon layer 17 and prevent occurrence of defects in the gate insulating film.

Since the longer the element isolation region 4 in the first direction, the higher the gettering effect is and the easier the defects can be attracted, a gettering effect can be enhanced further by continuously forming the element isolation region 4 extending in the first direction without interrupting it below the gate electrode wiring 3 in the present embodiment. In the present embodiment, the element isolation region 4 extending in the first direction is arranged below the gate electrode wiring 3 extending in the second direction. At this time, the element isolation region 4 protrudes from the both end portions of the gate electrode wiring 3 in the first direction. In other words, the both end portions of the gate electrode wiring 3 in the first direction extending in the second direction are arranged over the element isolation region 4.

In order to control the potential (substrate potential) of the p− well, there may be a method of forming a low-resistance p+ semiconductor region (corresponding to the p+ extraction region 5 shown in FIG. 1) over the p− well formed at a position not overlapping with the gate electrode wiring and the gate electrode in the plane of the SOI substrate and controlling the potential of the p− well through a contact plug formed over the p+ type semiconductor region. In the method of forming a contact plug over the p− well formed at a position not overlapping with the gate electrode wiring and the gate electrode, however, a region (space) for forming a p+ semiconductor region to be coupled to the contact plug should be formed newly over the main surface of the SOI substrate in the plane of the SOI substrate, leading to an increase in the element area (size of a semiconductor chip including an n channel MOSFET). This needs formation of the gate electrode wiring while diverting it so as not to overlap with the p+ type semiconductor region or formation of a new contact plug for supplying a potential to the gate electrode wiring and inevitably complicates the structure of the semiconductor device.

In the present embodiment, as illustrated in FIG. 1, the p+ extraction region 5 is formed in the p− well 12 (not illustrated) at a position overlapping with the gate electrode wiring 3 and the well contact plug 8 is provided in the hole portion 27 obtained by opening the gate electrode wiring 3 over the p+ extraction region 5. It is therefore not necessary to form a new region for coupling the contact plug to the well, thereby preventing an increase in the element surface of the semiconductor device and preventing the structure of the semiconductor device from becoming more complicated.

Next, manufacturing steps of the semiconductor device of the present embodiment will be described referring to drawings. FIGS. 6 to 20 are fragmentary cross-sectional view during the manufacturing steps of the semiconductor device according to First Embodiment of the invention, for example, a semiconductor device having an n channel MOSFET. Incidentally, in FIGS. 6 to 20, a region on the left side of the drawing represented by MR is a fragmentary cross-sectional view of a semiconductor device during the manufacturing steps at the same position as that in the cross-sectional view taken along a line A-A of FIGS. 1 and 2 and shows an n-channel-MOSFET formation region in which a source/drain region, a gate electrode, and a channel of an n channel MOSFET are formed. In FIGS. 6 to 20, a region on the right side of the drawing represented by CR is a fragmentary cross-sectional view of the semiconductor device during manufacturing steps at the same position as that of the cross-sectional view taken along a line B-B of FIGS. 1 and 2 and shows a contact plug formation region for providing a potential for the well and source.

Figure 6:
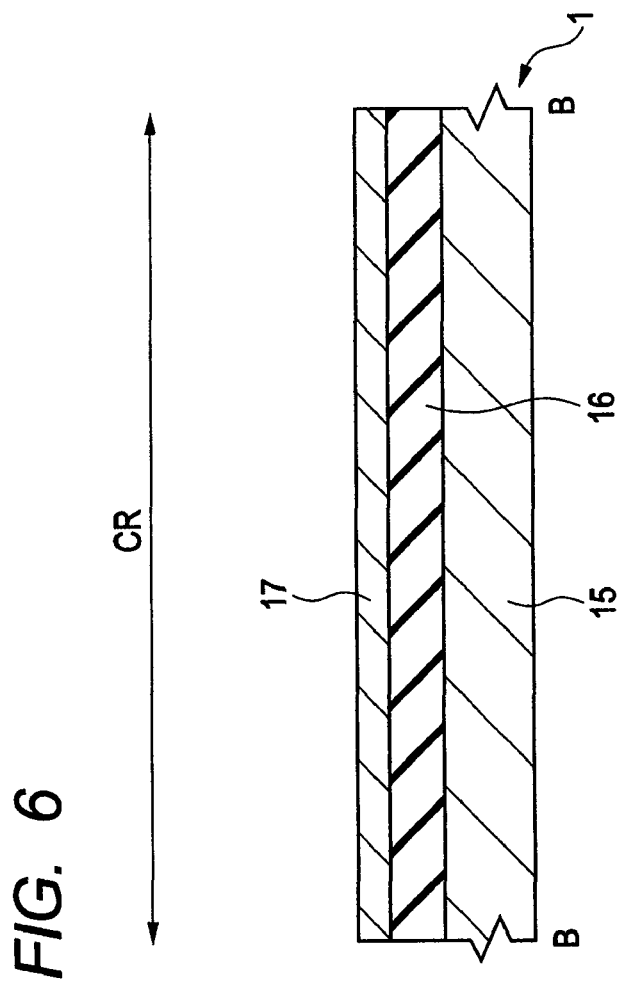
FIG. 6 is a fragmentary cross-sectional view showing a manufacturing method of the semiconductor device according to First Embodiment of the invention.
Figure 6:
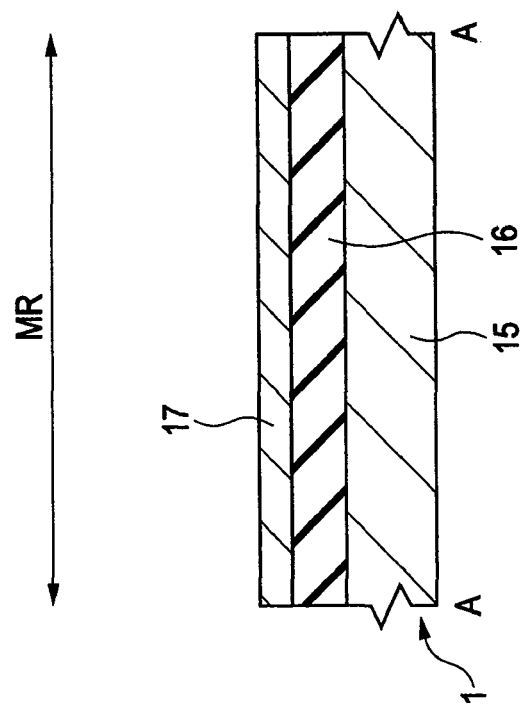

First, as illustrated in FIG. 6, an SOI substrate 1 is prepared. The SOI substrate 1 can be prepared by using an SIMOX (silicon implanted oxide) process in which $O_2$ (oxygen) is ion-implanted at a high energy into the main surface of a semiconductor substrate made of Si (silicon) and heat treatment is then performed to bind it with Si (silicon) to form an oxide film (BOX film) at a position a little deeper than the surface of the semiconductor substrate. Alternatively, the SOI substrate 1 can be prepared by laminating a semiconductor substrate having an oxide film on the surface with another semiconductor substrate made of Si (silicon) under high heat and pressure, followed by thinning of the silicon layer on one side by polishing.

The SOI substrate 1 is a semiconductor substrate having a BOX film 16 formed over a high resistance support substrate 15 made of Si (silicon) and a silicon layer 17 formed on the BOX film 16, and the silicon layer 17 is a layer made of single crystal silicon having a specific resistance of from about 1 to 10 Ωcm.

Figure 7:
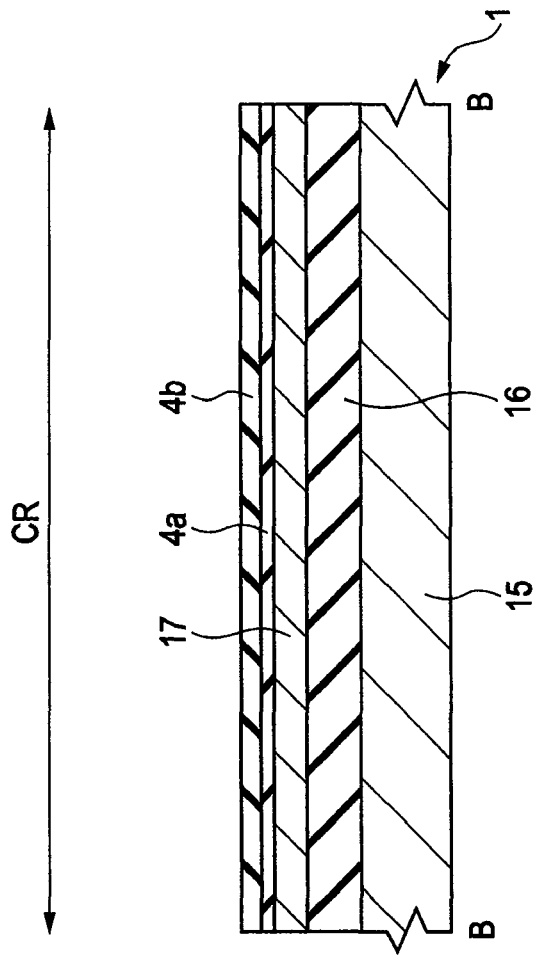
FIG. 7 is a fragmentary cross-sectional view showing the manufacturing method of the semiconductor device following FIG. 6.

Then, as illustrated in FIG. 7, the SOI substrate 1 is thermally oxidized to form an insulating film 4a on the surface thereof, followed by deposition of an insulating film 4b thereover by using CVD or the like process. The insulating film 4a is made of silicon oxide or the like, while the insulating film 4b is made of a silicon nitride film or the like.

Figure 8:
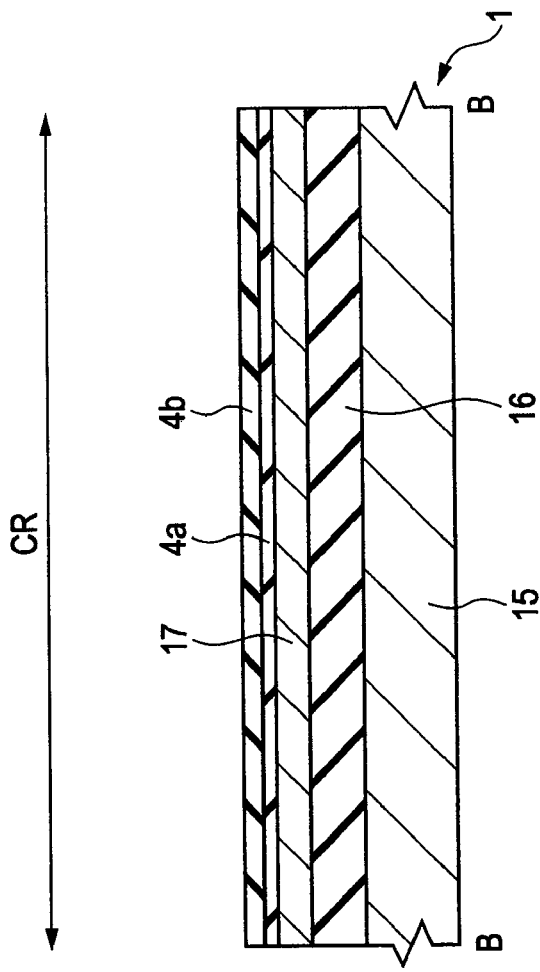
FIG. 8 is a fragmentary cross-sectional view showing the manufacturing method of the semiconductor device following FIG. 7.

Then, as illustrated in FIG. 8, with a photoresist pattern (not illustrated) as an etching mask, the insulating film 4b, the insulating film 4a, and the silicon layer 17 are dry etched successively to form a trench (element isolating trench) 4c in the SOI substrate 1 of an element isolation formation region. The trench 4c is an element isolating trench, that is, a trench for forming an element isolation region 4 which will be described later.

Figure 9:
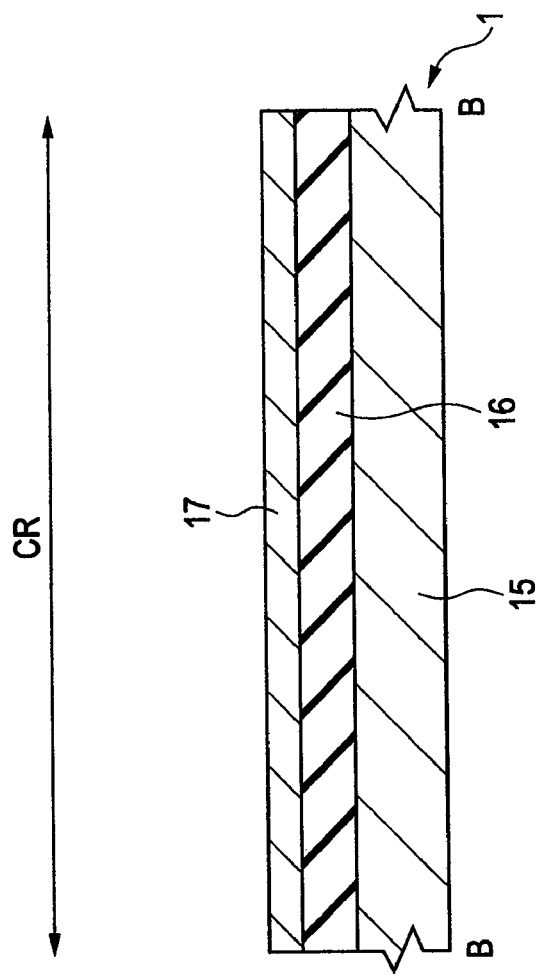
FIG. 9 is a fragmentary cross-sectional view showing the manufacturing method of the semiconductor device following FIG. 8.
Figure 9:
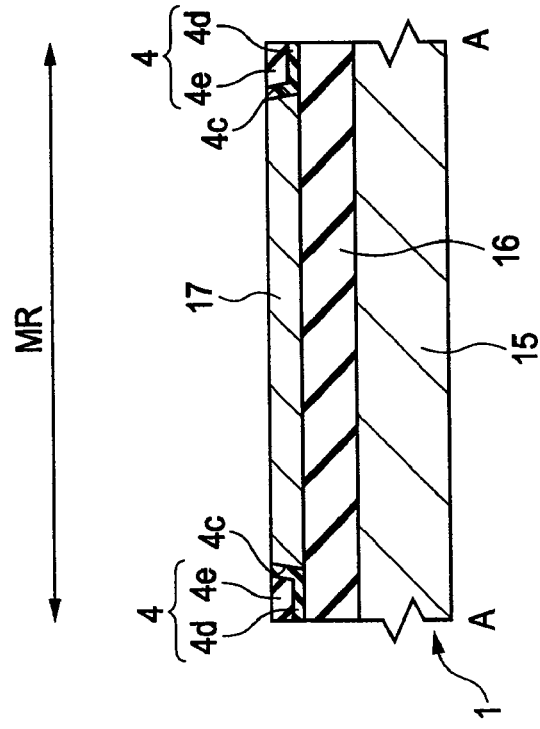

Then, as illustrated in FIG. 9, after removal of the insulating film 4b through wet etching with hot phosphoric acid, an insulating film 4d is formed over the main surface of the SOI substrate 1 including the inside portions (side walls and bottom portion). An insulating film 4e is formed (deposited) over the main surface of the SOI substrate 1 (that is, over the insulating film 4d) by using CVD or the like so as to embed the trench 4c therewith.

The insulating film 4d is made of a silicon oxide film or a silicon oxynitride film. When the insulating film 4d is a silicon oxynitride film, volume expansion, which will otherwise occur due to oxidation of the side walls of the trench 4c caused by the heat treatment in the steps after a step of forming the insulating film 4d, can be prevented and a compression stress acting on the SOI substrate 1 can be reduced.

The insulating film 4e is a silicon oxide film or an $O_3$-TEOS oxide film formed through an HDP-CVD (high density plasma CVD) process. The $O_3$-TEOS oxide film is a silicon oxide film formed through thermal CVD by using $O_3$ (ozone) and TEOS (tetramethoxysilane which may also be called "tetra ethyl ortho silicate") as raw material gases (source gases). When the insulating film 4e is a silicon oxide film formed through the HDP-CVD, the insulating film 4d is effective for preventing damage to the SOI substrate 1 when the insulating film 4e is formed by deposition.

Then, the insulating film 4e is subjected to CMP (chemical mechanical polishing) to remove the insulating film 4e outside the trench 4c and leave the insulating films 4d and 4e in the trench 4c, whereby an element isolation region (element isolation) 4 made of the insulating films 4d and 4e.

Then, the SOI substrate 1 is heat treated at a temperature of, for example, about 1150° C. to densify the insulating film 4e embedded in the trench 4c. Before densification, the silicon oxide film formed through HDP-CVD is more dense than the $O_3$-TEOS oxide film. When the insulating film 4e is an $O_3$-TEOS oxide film, densification causes shrinkage of the insulating film 4e and is effective for reducing compressive stress acting on the SOI substrate 1. On the other hand, when the insulating film 4e is a silicon oxide film formed through HDP-CVD, shrinkage of the insulating film 4e is less than that of the $O_3$-TEOS oxide film upon densification so that a compressive stress of the element isolation region 4 acting on the SOI substrate 1 increases.

Thus, the element isolation region 4 is formed by embedding the trench 4c with the insulating films 4d and 4e. In the present embodiment, the element isolation region 4 is formed not through an LOCOS (local oxidization of silicon) process but preferably through an STI (shallow trench isolation) process. This means that the element isolation region 4 of the present embodiment is preferably made of an insulator (insulating films 4d and 4e, in this embodiment) embedded in the element isolating trench 4c formed in the SOI substrate 1. The n channel MOSFET Qn (more specifically, the gate insulating film 18, the gate electrode 2, the source region 6, and the drain region 7 configuring the n channel MOSFET Qn) described using FIGS. 1 and 2 is formed in an active region specified (surrounded) with the element isolation region 4.

Figure 10:
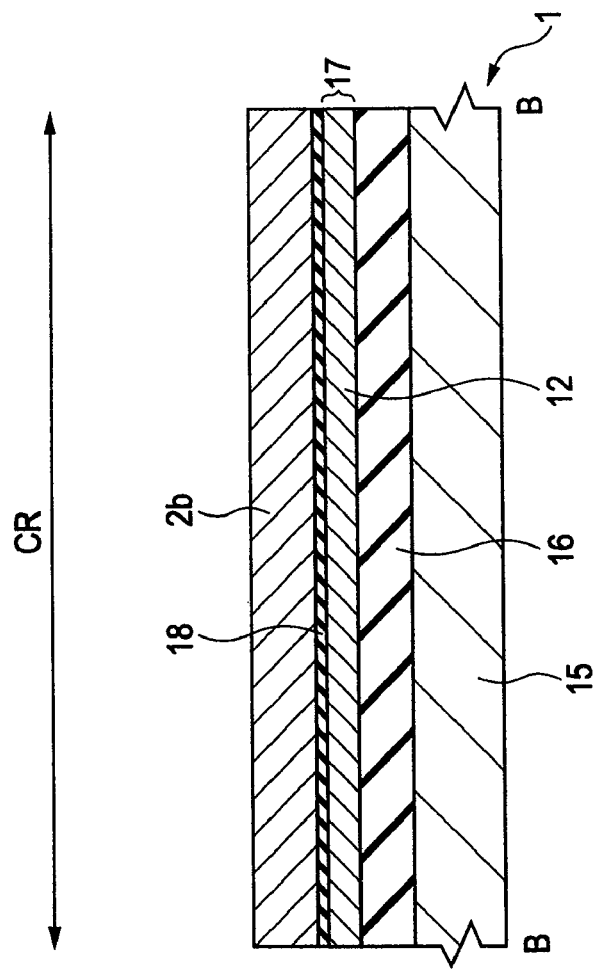
FIG. 10 is a fragmentary cross-sectional view showing the manufacturing method of the semiconductor device following FIG. 9.

Then, as illustrated in FIG. 10, a p⁻ well 12 is formed in the silicon layer 17 which is the main surface of the SOI substrate 1. The p⁻ well 12 can be formed, for example, by ion-implanting p type impurities such as B (boron) into the SOI substrate 1 of the n channel MOSFET formation region MR.

Then, after cleansing (washing) of the surface of the SOI substrate 1 through wet etching with, for example, an aqueous hydrofluoric acid (HF) solution, a gate insulating film 18 is formed on the surface (that is, the surface of the p⁻ well 12) of the SOI substrate 1. The gate insulating film 18 is made of, for example, a thin silicon oxide film and can be formed, for example, by thermal oxidation.

Then, a silicon film 2b such as polycrystalline silicon film is formed as a conductor film for gate electrode formation over the SOI substrate 1 (that is, on the gate insulating film 18 of the p⁻ well 12). Of the silicon film 2b, the silicon film 2b of the n channel MOSFET formation region MR (a region which will be a gate electrode 2, a gate electrode wiring 3, and a gate coupling portion later) is a low-resistance n-type semiconductor film (doped polysilicon film) by ion implantation of n type impurities such as P (phosphorus) or As (arsenic) with a photoresist film (not illustrated) as a mask. The silicon film 2b, which is an amorphous silicon film upon formation, can be converted into a polycrystalline silicon film by the heat treatment after film formation (after ion implantation).

Figure 11:
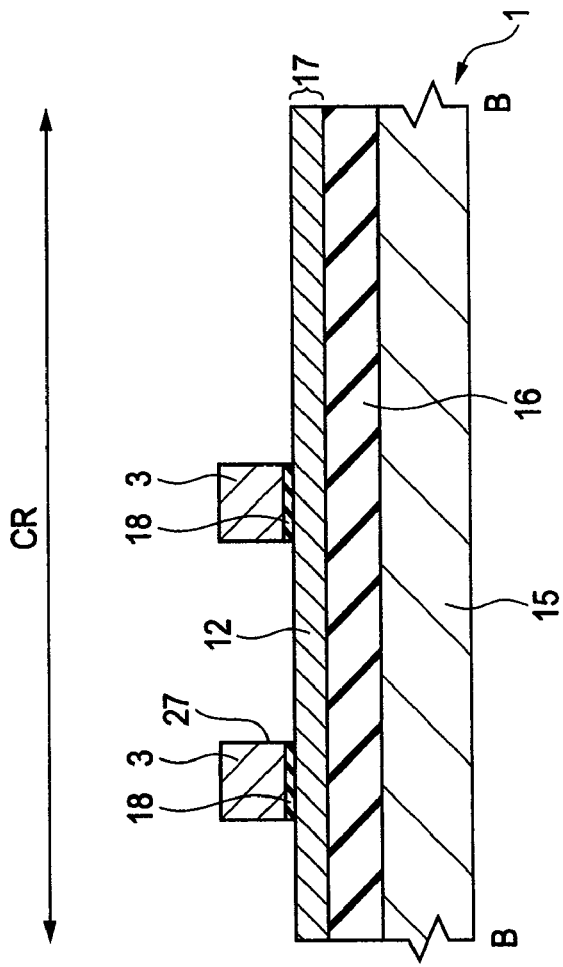
FIG. 11 is a fragmentary cross-sectional view showing the manufacturing method of the semiconductor device following FIG. 10.
Figure 11:
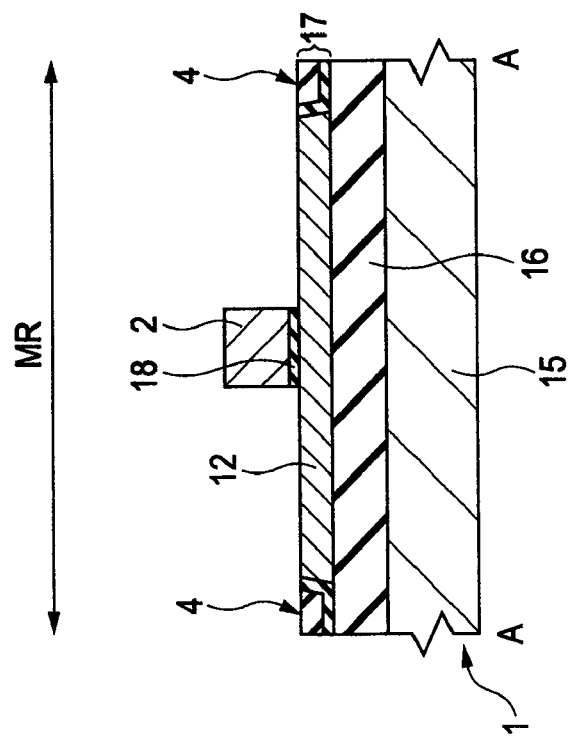

As illustrated in FIG. 11, the silicon film 2b is then patterned using photolithography and dry etching to form a gate electrode 2 made of the silicon film 2b in the n channel MOSFET formation region MR and a gate electrode wiring 3 made of the silicon film 2b in a contact plug formation region. Incidentally, although not illustrated, a gate coupling portion made of the silicon film 2b can be formed at an end portion of the extending gate electrode wiring 3 in the same step. The gate electrode wiring 3 has a hole portion 27 penetrating from the top surface of the gate electrode wiring 3 to the bottom surface of the gate insulating film 18 and exposing the top surface of the p⁻ well 12.

The gate electrode 2 and the gate electrode wiring 3, which will be the gate electrode of an n channel MOSFET is made of polycrystalline silicon implanted with n type impurities (n type semiconductor film, doped polysilicon film) and is formed over the p⁻ well 12 via the gate insulating film 18. This means that the gate electrode 2 and the gate electrode wiring 3 are formed over the gate insulating film 18 of the p⁻ well 12.

Figure 12:
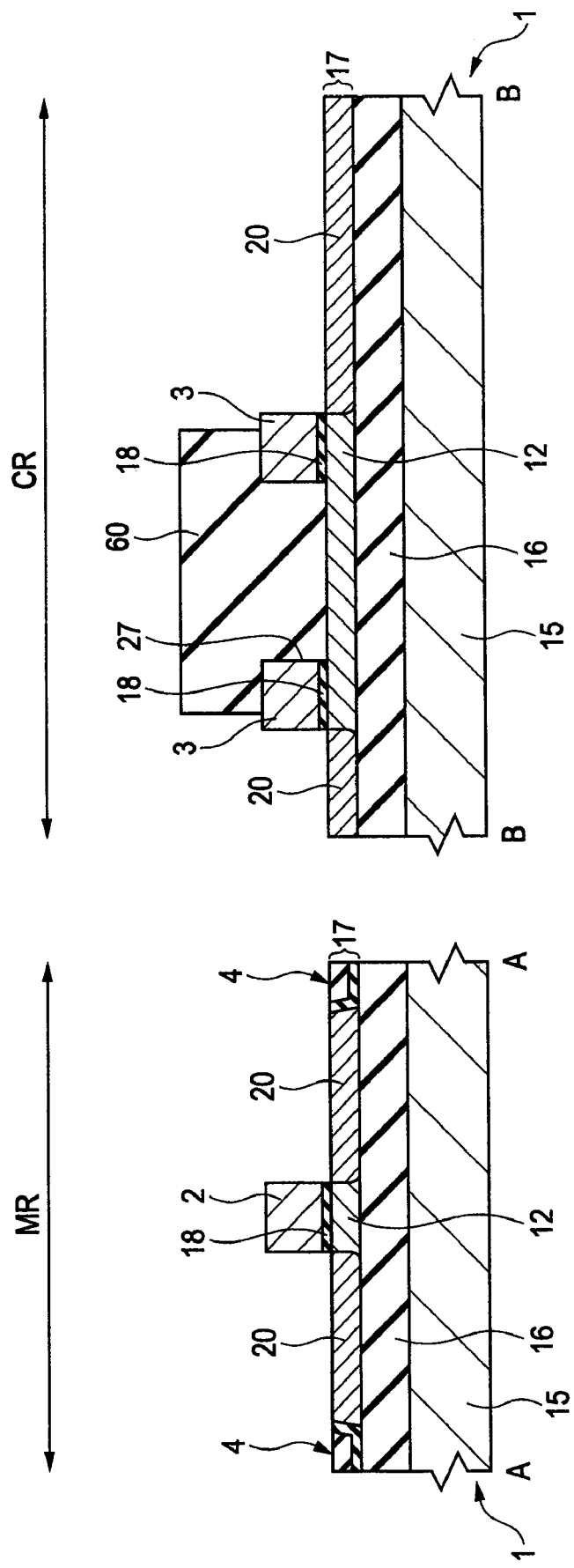
FIG. 12 is a fragmentary cross-sectional view showing the manufacturing method of the semiconductor device following FIG. 11.

As illustrated in FIG. 12, a photoresist film 60 is formed in the contact plug formation region CR by using photolithography so as to cover a portion of the top surface of the gate electrode wiring 3 and the hole portion 27. The main surface of the SOI substrate 1 is then implanted with n type impurities such as P (phosphorus) or As (arsenic)) to form (a pair of) extension regions 20, which are n⁻ type semiconductor regions, in the silicon layer 17 except respective portions below the photoresist film 60, the gate electrode 2, and the gate electrode wiring 3 and a portion below the hole portion 27. This means that the extension regions 20 are formed in regions of the p⁻ well 12 on both sides of the gate electrode 2.

Figure 13:
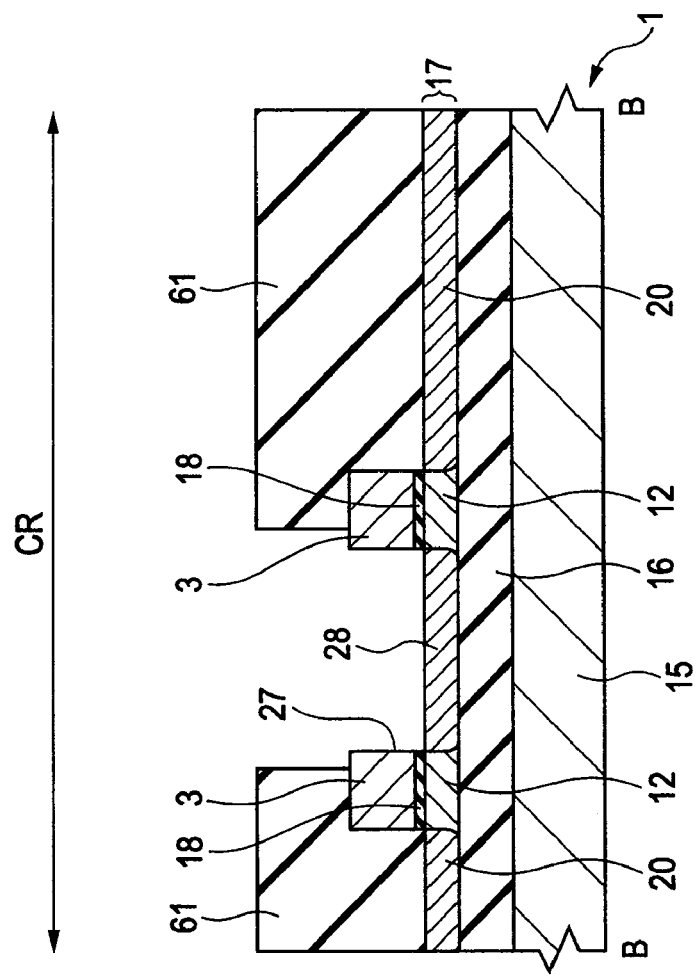
FIG. 13 is a fragmentary cross-sectional view showing the manufacturing method of the semiconductor device following FIG. 12.

As illustrated in FIG. 13, after removal of the photoresist film 60, a photoresist film 61 for exposing a portion of the top surface of the gate electrode wiring 3 and the hole portion 27 is formed over the SOI substrate 1 by using photolithography. The photoresist film 61 covers therewith the top surfaces of the extension region 20 and the gate electrode 2. P type semiconductor regions 28, which are p⁻ type semiconductor regions, are then formed in the silicon layer 17 except respective portions below the photoresist film 61 and the gate wiring 3 by ion implantation of p type impurities such as B (boron) into the main surface of the SOI substrate 1. This means that p type semiconductor regions 28 are formed only in the silicon layer 17 below the hole portion 27 of the gate electrode wiring 3.

Figure 14:
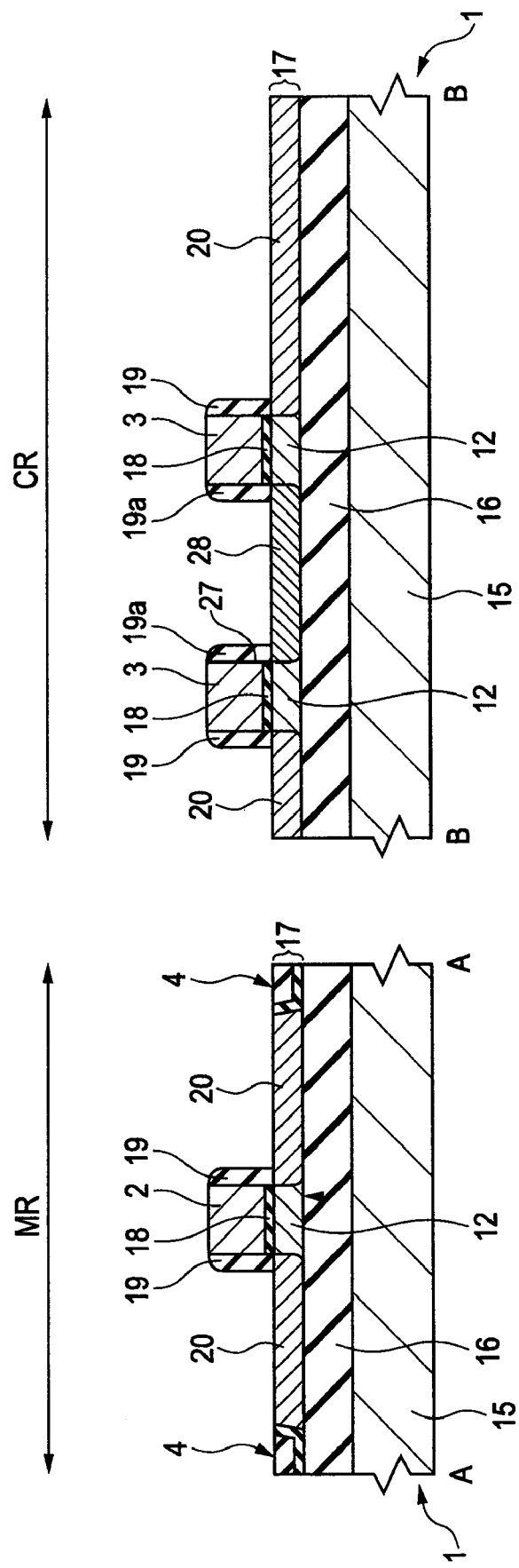
FIG. 14 is a fragmentary cross-sectional view showing the manufacturing method of the semiconductor device following FIG. 13.

As illustrated in FIG. 14, after removal of the photoresist film 61, side wall spacers or sidewalls (side wall insulating films) 19 made of, for example, silicon oxide or silicon nitride, or a stack of these insulating films are formed as an insulating film on the side walls of each of the gate electrode 2 and the gate electrode wiring 3. The sidewalls 19 can be formed, for example, by depositing a silicon oxide film or a silicon nitride film, or a film stack of them over the SOI substrate 1 and then anisotropically etching the silicon oxide film or the silicon nitride film, or the film stack by using an RIE (reactive ion etching) process or the like process.

Figure 15:
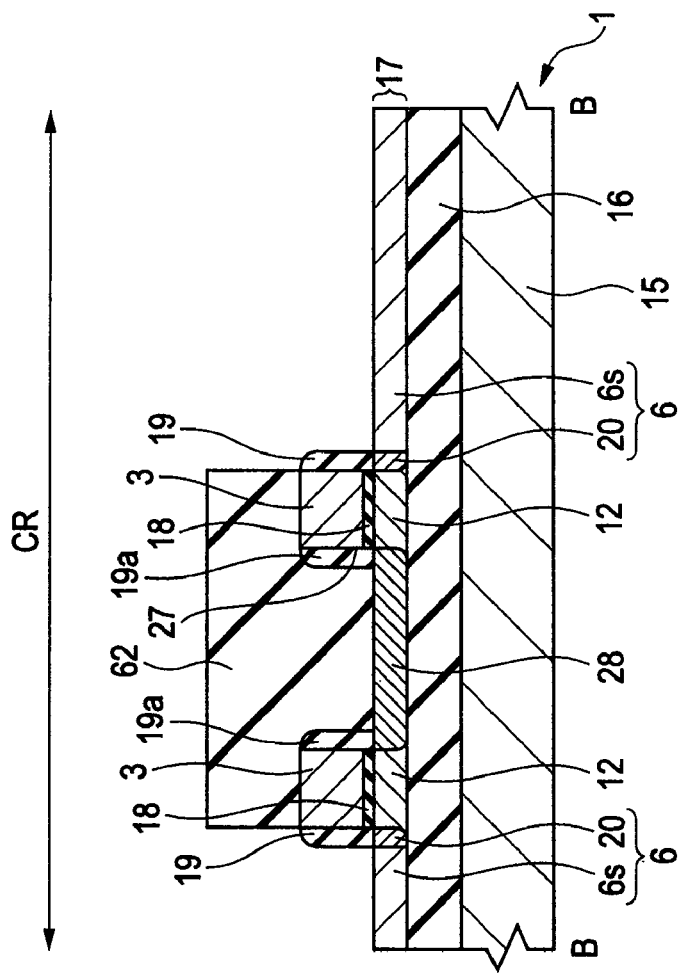
FIG. 15 is a fragmentary cross-sectional view showing the manufacturing method of the semiconductor device following FIG. 14.
Figure 15:
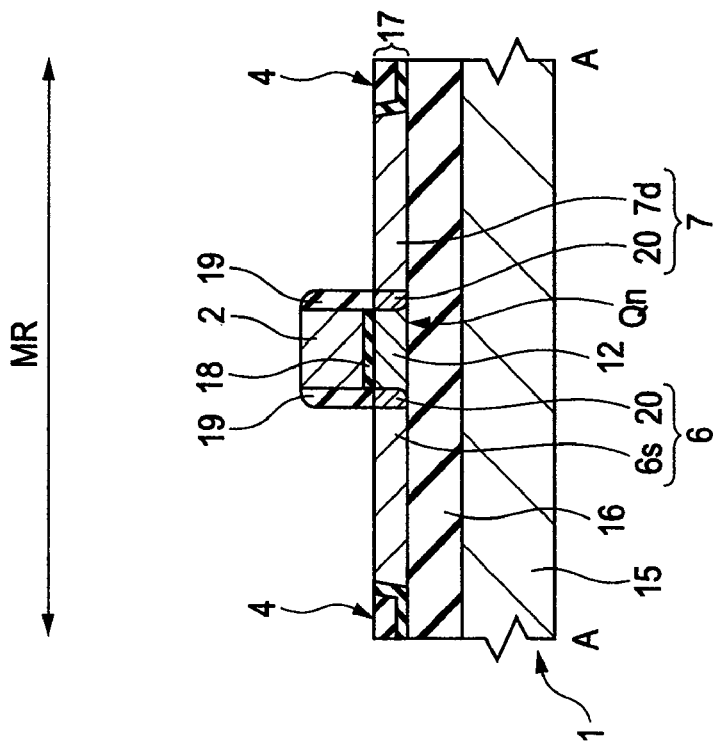

As illustrated in FIG. 15, a photoresist film 62 is formed using photolithography so as to cover therewith the top surface of the p type semiconductor region 28 below the hole portion 27. Then, (a pair of) an n⁺ semiconductor region 6s and an n⁺ semiconductor region 7d are formed in regions on both sides of the gate electrode 2 and the sidewall 19 of the p⁻ well 12 by ion-implanting n type impurities such as P (phosphorus) or As (arsenic). After ion implantation, the impurities thus introduced can be subjected to annealing treatment of for example, about 1050° C. in order to activate the impurities thus introduced.

The n⁺ semiconductor region 6s and the n⁺ semiconductor region 7d have a higher impurity concentration than the extension region 20. As a result, an n type semiconductor region (impurity diffusion layer) functioning as a source or drain of the n channel MOSFET Qn is formed from n⁺ type semiconductor regions (impurity diffusion layer) 6s and 7d, and the extension region 20. Described specifically, the n⁺ semiconductor region 6s and the extension region 20 contiguous to the n⁺ semiconductor region 6s configure the source region 6, while the n⁺ semiconductor region 7d and the extension region 20 contiguous to the n⁺ semiconductor region 7d configure the drain region 7. This means that the source region 6 and the drain region 7 of the n channel MOSFET Qn have an LDD (lightly doped drain) structure. The extension region 20 is formed in self alignment with the gate electrode 2 and the n⁺ semiconductor region 6s and the n⁺ semiconductor region 7d are formed in self alignment with the sidewalls 19 on the side walls of the gate electrode 2.

Thus, the n channel MOSFET Qn is formed in the p⁻ well 12 as a field effect transistor. The n channel MOSFET Qn can be regarded as an n channel field effect transistor.

Figure 16:
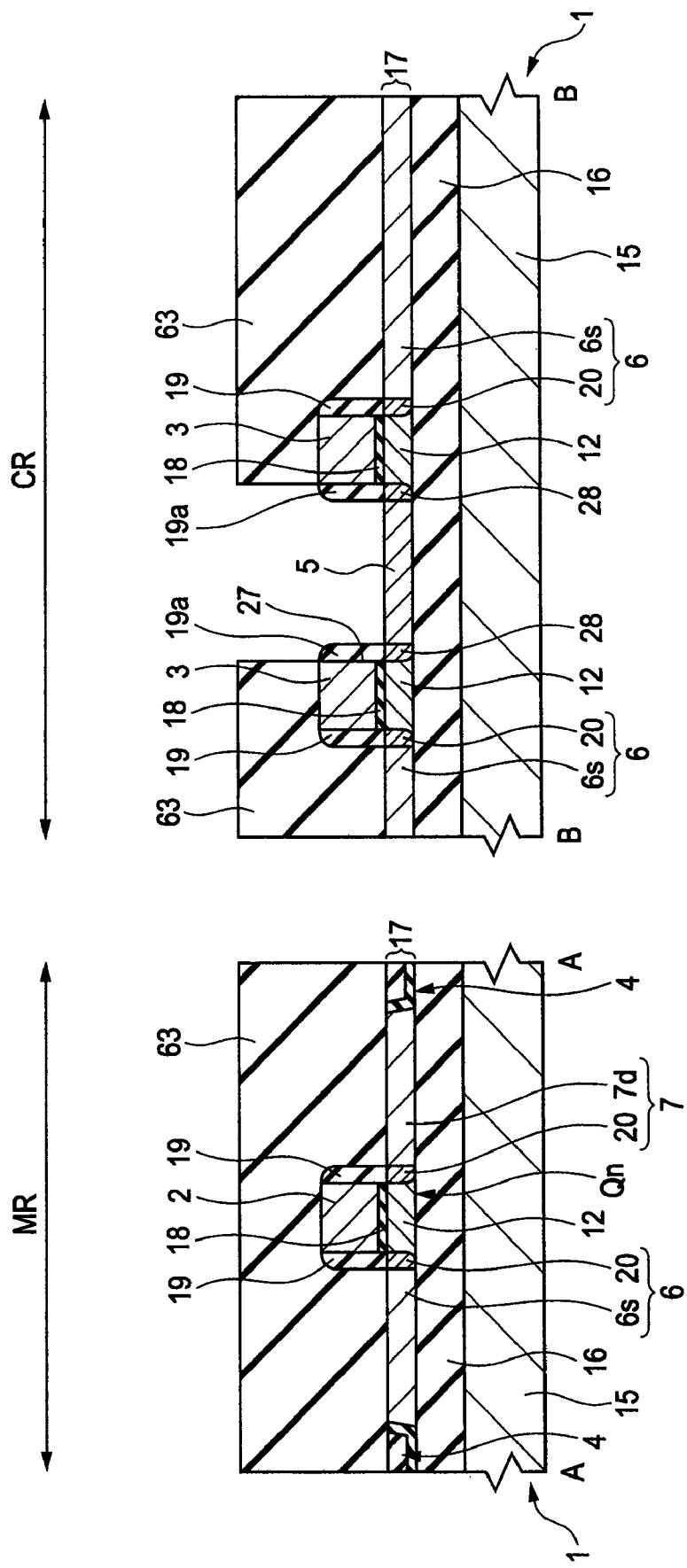
FIG. 16 is a fragmentary cross-sectional view showing the manufacturing method of the semiconductor device following FIG. 15.

Then, as illustrated in FIG. 16, after removal of the photoresist film 62, a photoresist film 63 is formed using photolithography so as to cover therewith the top surface of the source region 6 and the drain region 7. Upon photolithography, the top surfaces of the p type semiconductor region 28 not covered with the sidewall 19 and the gate electrode wiring 3 are exposed from the photoresist film 63. Then, a p type impurity such as B (boron) is ion-implanted into the exposed p type semiconductor region 28 to form a p⁺ extraction region 5 in the silicon layer 17 in a region between sidewalls 19 formed in the hole portion 27. After ion implantation, spike anneal treatment, for example, at 1050° C. can also be performed as anneal treatment for activating the thus-implanted impurity. The p⁺ extraction region 5 is a region having a higher impurity concentration than the p type semiconductor region 28.

With regard to the formation of the source region 6, the drain region 7, and the p⁺ extraction region 5 in the present embodiment as described above, regions having different conductivity types each other are formed in the silicon layer 17 by respective steps, that is, ion-implanting an impurity into the top surface of the SOI substrate 1 while covering either one of the formation regions with a photoresist film. Described specifically, formation of the extension region 20 is followed by the formation of the p type semiconductor region 28. The extension region 20 may be formed after formation of the p type semiconductor region 28. Similarly, the formation of the n⁺ semiconductor region 6s and the n⁺ semiconductor region 7d is followed by the formation of the p⁺ extraction region 5 in the present embodiment, but, after formation of the p⁺ extraction region 5, the n⁺ semiconductor region 6s and the n⁺ semiconductor region 7d may be formed.

Figure 17:
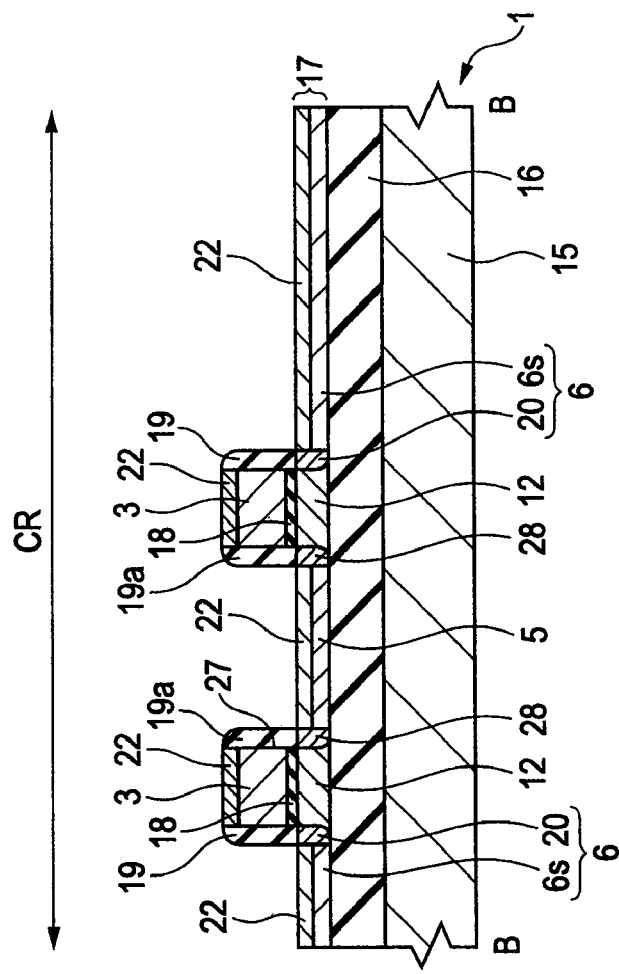
FIG. 17 is a fragmentary cross-sectional view showing the manufacturing method of the semiconductor device following FIG. 16.

As illustrated in FIG. 17, after removal of the photoresist film 63, low-resistance silicide layers 22 are then formed on the respective surfaces of the gate electrode 2, the gate electrode wiring 3, the p⁺ extraction region 5, the source region 6, and the drain region 7 (meaning the n⁺ semiconductor region 6s and the n⁺ semiconductor region 7d) of the n channel MOSFET Qn by using salicide (self aligned silicide) technology.

More specifically, after formation of the structure of FIG. 16 as described above, the surfaces of the gate electrode 2, the gate electrode wiring 3, the p⁺ extraction region 5, the n⁺ semiconductor region 6s, and the n⁺ semiconductor region 7d are exposed and then, a metal film is formed (deposited) by using, for example, sputtering over the main surface (whole surface) of the SOI substrate 1 including the top surfaces of the gate electrode 2, the gate electrode wiring 3, the p⁺ extraction region 5, the sidewall 19, and the n⁺ semiconductor region 7d. This means that a metal film is formed over the SOI substrate 1 including the top surfaces of the gate electrode 2, the gate electrode wiring 3, the p⁺ extraction region 5, the n⁺ semiconductor region 6s, and the n⁺ semiconductor region 7d so as to cover the gate electrode 2.

It is more preferred to carry out, prior to the deposition step of the metal film, dry cleaning treatment with at least any one of an HF gas, an NF₃ gas, an NH₃ gas, and an H₂ gas to remove a natural oxide film from the surfaces of the gate electrode 2, the gate electrode wiring 3, the p⁺ extraction region 5, the n⁺ semiconductor region 6s, and the n⁺ semiconductor region 7d and carry out the deposition step of the metal film without exposing the SOI substrate 1 to the air (oxygen-containing atmosphere). The metal film is, for example, a metal film containing Ni (nickel).

After formation of the metal film in such a manner, the SOI substrate 1 is heat treated in twice. Then the metal film reacts with Si (silicon) contained in the gate electrode 2, the gate electrode wiring 3, the p⁺ extraction region 5, the n⁺ semiconductor region 6s, and the n⁺ semiconductor region 7d to form a silicide layer 22 on the top surfaces of the gate electrode 2, the gate electrode wiring 3, the p⁺ extraction region 5, the n⁺ semiconductor region 6s, and the n⁺ semiconductor region 7d.

Described specifically, the heat treatment for the formation of the silicide layer 22 is performed in twice. The structure of FIG. 17 can be obtained by carrying out first heat treatment (first anneal treatment) at a temperature of from 250 to 300° C. and then after removal of the unreacted metal film, carrying out second heat treatment at a temperature of from about 500 to 600° C. The removal of the unreacted metal film can be effected by wet washing with sulfuric acid or wet washing with SPM (sulfuric acid hydrogen peroxide mixture: a mixture of sulfuric acid and hydrogen peroxide). As a result, the silicide layer 22 made of NiSi (nickel silicon), which is a compound of Ni (nickel) contained in the metal film and Si (silicon) contained in the gate electrode 2, the gate electrode wiring 3, the p⁺ extraction region 5, the n⁺ semiconductor region 6s, and the n⁺ semiconductor region 7d is formed on the respective top surfaces of the gate electrode 2, the gate electrode wiring 3, the p⁺ extraction region 5, the n⁺ semiconductor region 6s, and the n⁺ semiconductor region 7d.

Figure 18:
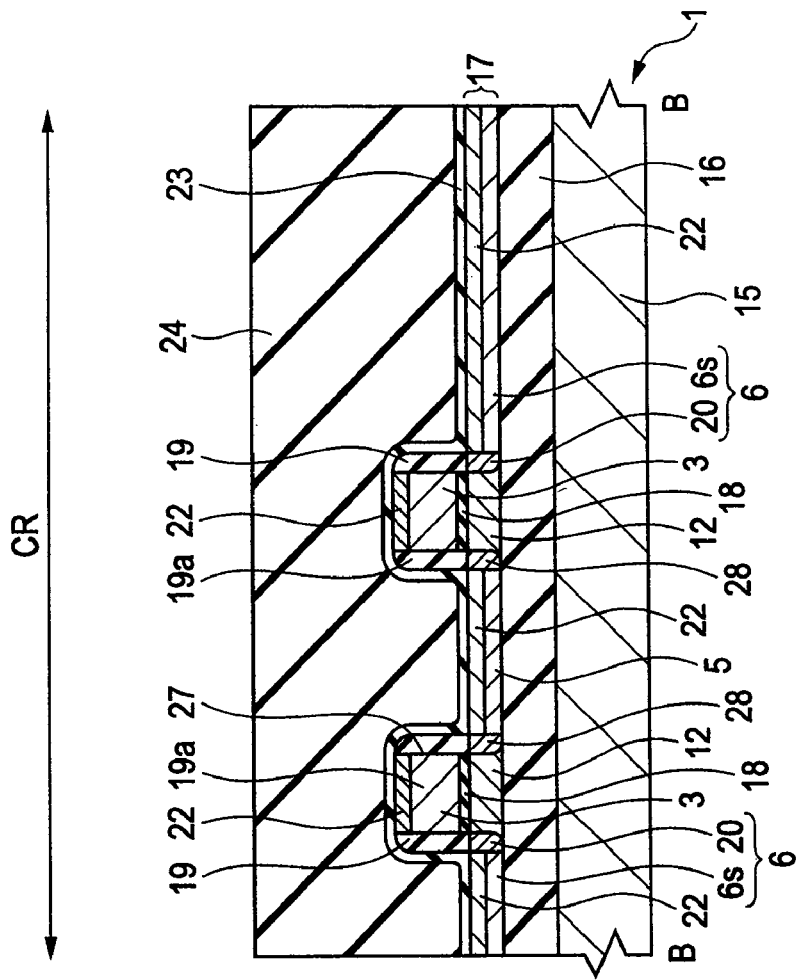
FIG. 18 is a fragmentary cross-sectional view showing the manufacturing method of the semiconductor device following FIG. 17.
Figure 18:
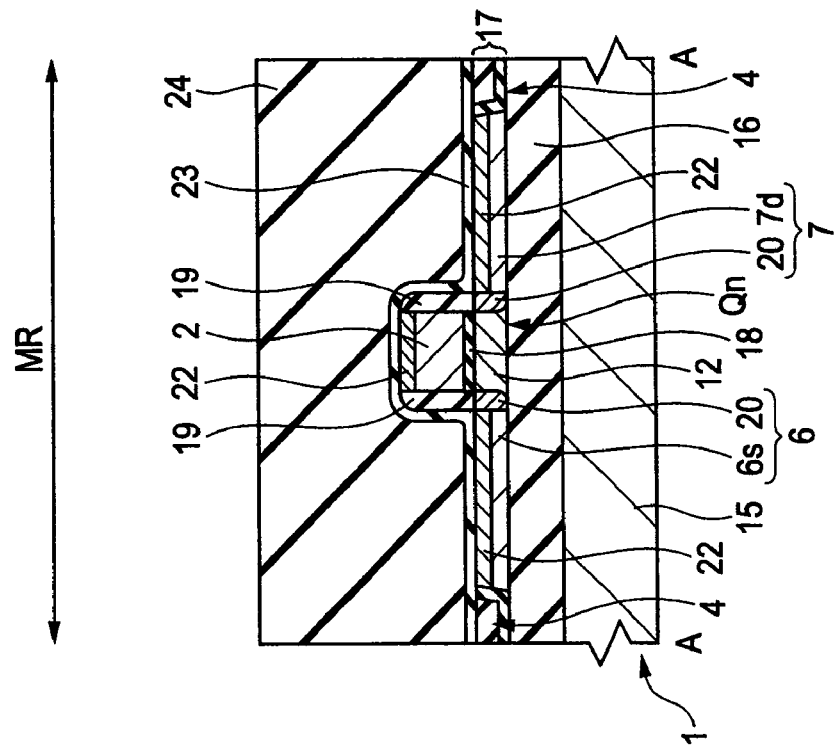

As illustrated in FIG. 18, an insulating film 23 is then formed over the main surface of the SOI substrate 1. Described specifically, the insulating film 23 is formed over the SOI substrate 1 including the top surface of the silicide layer 22 so as to cover the gate electrode 2 and the gate electrode wiring 3. The insulating film 23 is made of, for example, a silicon nitride film and can be formed through plasma CVD at a film forming temperature (substrate temperature) of about 450° C. An interlayer insulating film 24 thicker than the insulating film 23 is then formed over the insulating film 23. The interlayer insulating film 24 is made of, for example, a silicon oxide film and can be formed using TEOS through plasma CVD at a film forming temperature of about 450° C. The top surface of the interlayer insulating film 24 is then planarized, for example, by polishing the surface of the interlayer insulating film 24 by CMP. Even if the interlayer insulating film 24 has irregularities on the surface thereof due to a step difference in the underlying film, the interlayer insulating film 24 can have a planarized surface by polishing through CMP.

Figure 19:
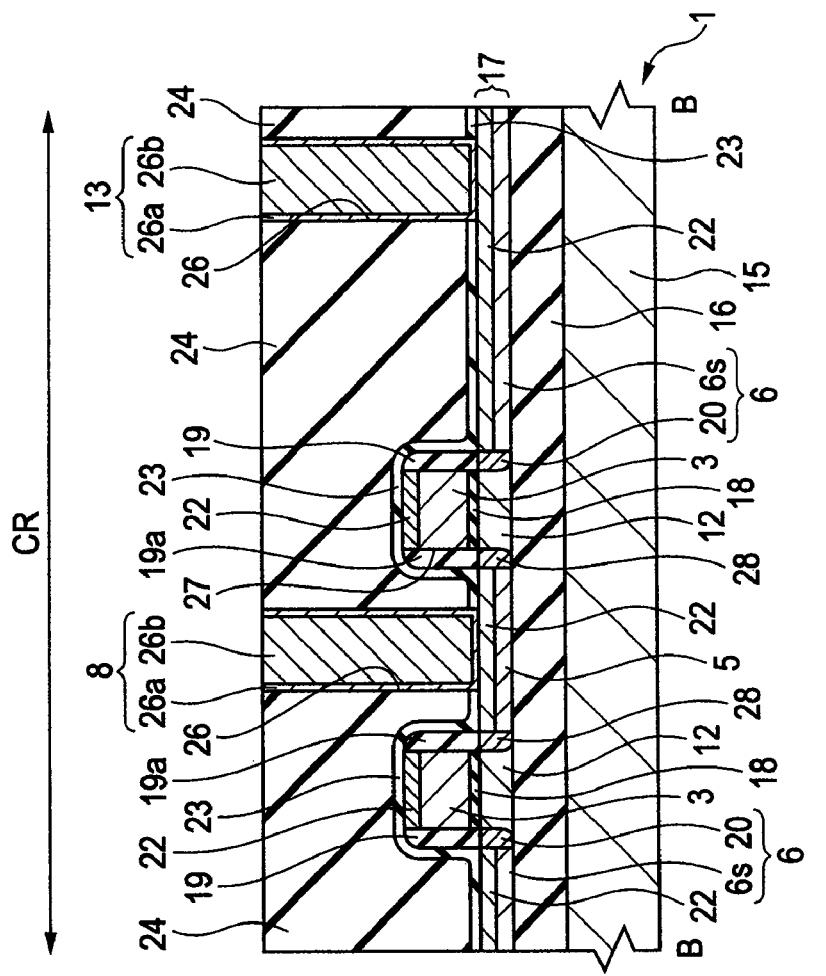
FIG. 19 is a fragmentary cross-sectional view showing the manufacturing method of the semiconductor device following FIG. 18.
Figure 19:
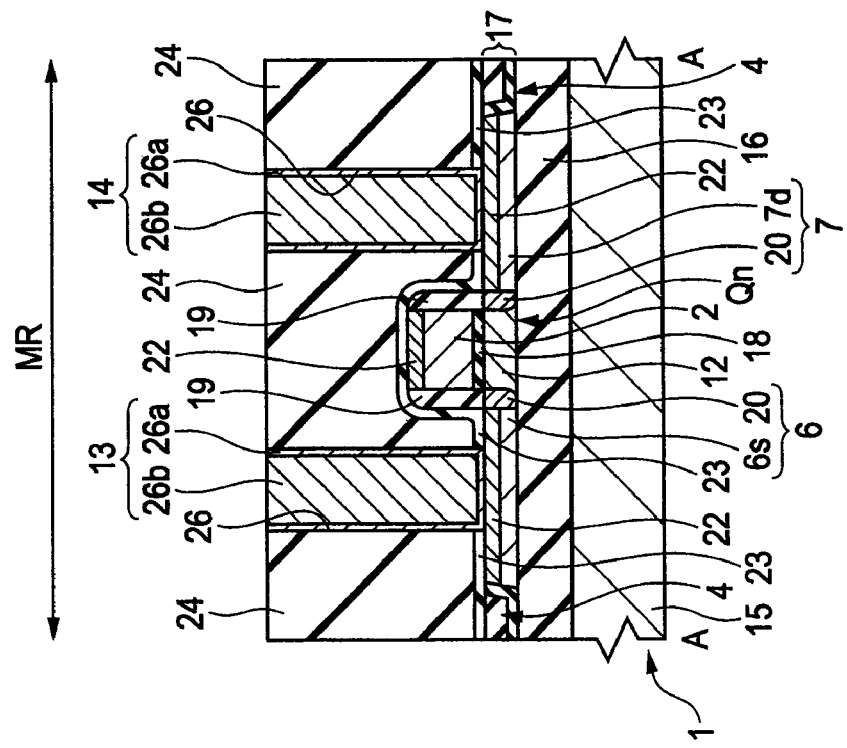

As illustrated in FIG. 19, the insulating film 23 and the interlayer insulating film are dry-etched with a photoresist pattern (not illustrated) formed over the interlayer insulating film 24 as an etching mask to form contact holes (through-holes, holes) 26 in the insulating film 23 and the interlayer insulating film 24. Dry etching of the interlayer insulating film 24 is performed under conditions facilitating etching of the interlayer insulating film 24 compared with the etching of the insulating film 23 and with the insulating film 23 functioned as an etching stopper, the contact holes 26 are formed in the interlayer insulating film 24. Then, the insulating film 23 is removed from the bottom of the contact hole 26 by dry etching under conditions facilitating the etching of the insulating film 23 compared with the etching of the interlayer insulating film 24. From the bottom of the contact hole 26, a portion of the main surface of the SOI substrate 1, for example, a portion of the silicide layer 22 on the surfaces of the n⁺ semiconductor region 6s and the n⁺ semiconductor region 7d and a portion of the silicide layer 22 on the surfaces of the gate electrode 2 and the gate electrode wiring 3.

A contact plug (conductor portion for coupling, embedded plug, embedded conductor portion) made of, for example, W (tungsten) is formed in the contact hole 26. Here, a source contact plug 13 is formed over the n⁺ semiconductor region 6s, a drain contact plug 14 is formed over the n⁺ semiconductor region 7d, and a well contact plug 8 is formed over the p⁺ extraction region 5. Each of the source contact plug 13, the drain contact plug 14, and the well contact plug 8 is formed, for example, by forming a barrier conductor film 26a (such as a titanium film, a titanium nitride film, or a film stack thereof) over the interlayer insulating film 24 including the inside (bottom and side walls) of the contact hole 26 through plasma CVD at a film forming temperature (substrate temperature) of 450° C. Then, a source contact plug 13, a drain contact plug 14, and a well contact plug 8 can be formed by forming a main conductor film 26b made of a tungsten film or the like through CVD so as to fill the contact hole 26 therewith and removing unnecessary portions of the main conductor film 26b and the barrier conductor film 26a on the interlayer insulating film 24 through CMP or etchback. The contact plugs formed over the gate connection portion 10 (not illustrated), the extraction region 5, the n⁺ semiconductor region 6s, and the n⁺ semiconductor region 7d are brought into contact, at the bottom portions thereof, with the silicide layer 22 over the surface of the gate connection portion 10, the p⁺ extraction region 5, the n⁺ semiconductor region 6s, and the n⁺ semiconductor region 7d and they are electrically coupled to each other. Although not illustrated, the silicide layer 22 is also formed on the top surface of the gate connection portion 10 and a gate contact plug 11 is formed over the gate connection portion 10 via the silicide layer 22.

Figure 20:
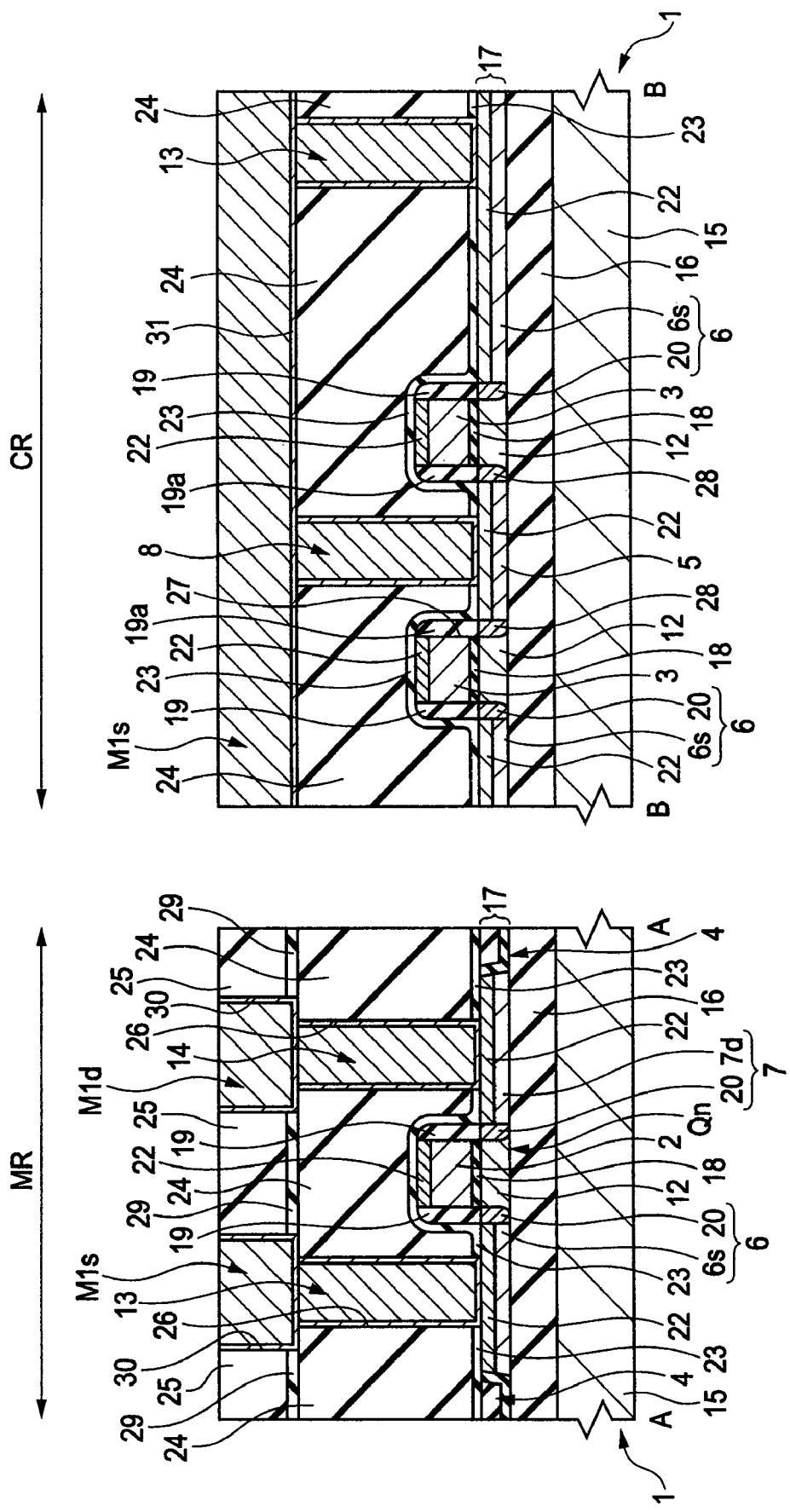
FIG. 20 is a fragmentary cross-sectional view showing the manufacturing method of the semiconductor device following FIG. 19.

As illustrated in FIG. 20, a stopper insulating film 29 and an interlayer insulating film 25 for metallization are formed successively over the interlayer insulating film 24 embedded with the source contact plug 13, the drain contact plug 14, the well contact plug 8, and the gate contact plug 11 (not illustrated). The stopper insulating film 29 serves as an etching stopper upon formation of a trench in the interlayer insulating film 25 and a material having an etch selectivity relative to the interlayer insulating film 25 is employed. For example, a silicon nitride film formed through plasma CVD is used as the stopper insulating film 29 and a silicon oxide film formed through plasma CVD can be used as the interlayer insulating film 25. Incidentally, a first-level wiring, which will be described next, is formed in the stopper insulating film 29 and the interlayer insulating film 25.

A first-level wiring is then formed through the single damascene process. First, by dry etching with a resist pattern (not illustrated) as a mask, a wiring trench 30 is formed in a predetermined region of the interlayer insulating film 25 and the stopper insulating film 29. Then, a barrier conductor film (barrier metal film) 31 is formed over the main surface of the SOI substrate 1 (that is, over the main surface of the interlayer insulating film 25 including the bottom and the side walls of the wiring trench). As the barrier conductor film 31, a titanium nitride film, a tantalum film, or a tantalum nitride film can be used. Then a copper seed layer is formed over the barrier conductor film 31 through CVD, sputtering, or the like process, followed by formation of a copper alloy film over the seed layer through electroplating or the like. The wiring trench 30 is embedded with the copper plated film. Then, the copper plated film, the seed layer, and the barrier conductor film 31 are removed from regions other than the wiring trench 30 by using CMP to form a first-level source wiring M1s, drain wiring M1d, and gate wiring M1g (not illustrated) having copper as a main conductive material. The source wiring M1s is coupled to the n⁺ semiconductor region 6s and the p⁺ extraction region 5 of the source region 6 of the n channel MOSFET Qn via the source contact plug 13 and the well contact plug 8. This means that the source wiring M1s is electrically coupled to the p⁻ well 12 via the well contact plug 8, the silicide layer 22, and the p⁺ extraction region 5. Incidentally, the well contact plug 8 penetrates through the hole portion 27 of the gate electrode wiring 3 and is coupled to the p+ extraction region 5 and is not electrically coupled to the gate electrode wiring 3, because it is insulated from the gate electrode wiring 3 via the interlayer insulating film 24 and the like. The drain wiring M1d is electrically coupled to the n+ semiconductor region 7d of the drain region 7 of the n channel MOSFET Qn via the drain contact plug 14. Although not illustrated, the gate wiring M1g is electrically coupled to the gate connection portion 10 via the gate contact plug 11. A second-level wiring is then formed through a dual damascene process, but illustrating and description of it is omitted. As a result, the semiconductor device of the present embodiment is completed.

As described above, the source wiring M1s and the p+ extraction region 5 are electrically coupled to each other via the well contact plug 8 formed in the hole portion 27 in the gate electrode wiring 3 illustrated in FIGS. 1 and 2, by which the potential of the well (p− well 12) of the MOSFET formed over the SOI substrate 1 can be controlled. This makes it possible to reduce the parasitic capacitance generated in the n channel MOSFET Qn.

In addition, in the present embodiment, since crystal defects produced in the silicon layer 17 can be attracted to the element isolation region 4 by making use of a gettering effect produced by continuously forming the element isolation region 4 extending in the first direction, defects which will otherwise occur in the gate insulating film 18 or the source region 6 and the drain region 7 can be prevented, making it possible to further improve the reliability of the semiconductor device.

Further, since a region (overstrike region 5b) introduced with both p type impurities and n type impurities at a high concentration is not formed in the present embodiment unlike the semiconductor device shown in FIG. 29 as a comparative example, the source/drain region or the gate insulating film can be prevented from occurrence of defects, making it possible to control the potential of the well (p− well 12) of the MOSFET without impairing the reliability of the semiconductor device.

Second Embodiment

Figure 21:
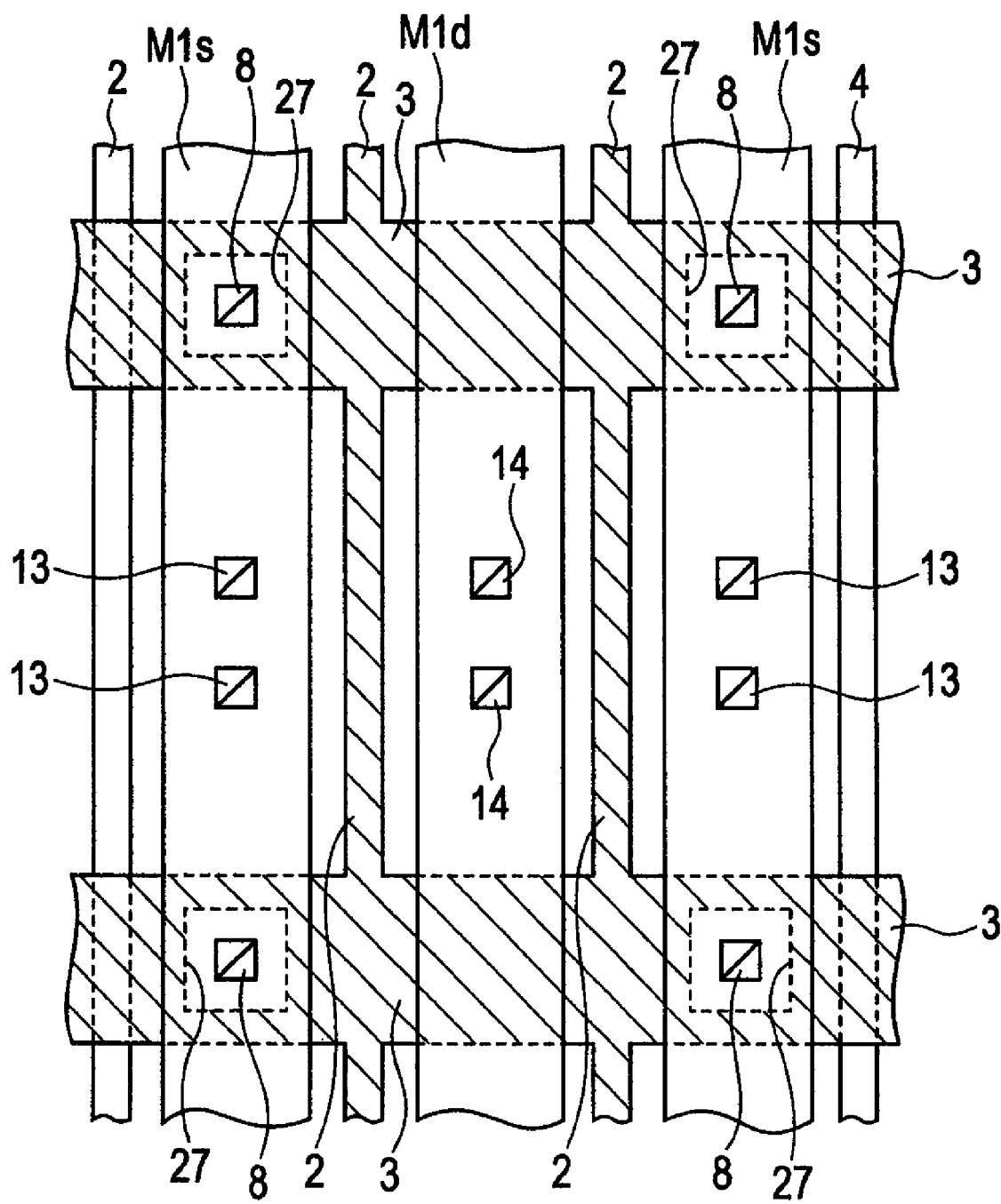
FIG. 21 is a planar layout of a semiconductor device according to Second Embodiment of the invention.

Described in the above embodiment is a semiconductor device having an n channel MOSFET having a drain not in common between two adjacent cells in a second direction which is perpendicular to a first direction, which is an extending direction of the gate electrode 2 and runs along the main surface of the SOI substrate. In the present embodiment, on the other hand, a semiconductor device having an n channel MOSFET having a drain in common between two adjacent cells in the second direction will be described referring to FIG. 21. FIG. 21 is a planar layout of the semiconductor device according to the present embodiment.

The fundamental constitution of the semiconductor device according to the present embodiment is similar to the semiconductor device according to First Embodiment, but as illustrated in FIG. 21, two adjacent element isolation, regions 4 have therebetween two cells in the second direction and these two cells have in common a drain region 7 (not illustrated) below the drain wiring M1d. Incidentally, the SOI substrate is not illustrated in FIG. 21 and only the gate electrode 2, the gate electrode wiring 3, the element isolation region 4, the source wiring M1s, the drain wiring M1d, the hole portion 27, the well contact plug 8, the source contact plug 13, and the drain contact plug 14 are illustrated to facilitate understanding of this drawing. In addition, although not illustrated, the gate electrode wiring 3 has, at an end portion thereof, a gate connection portion for controlling the potential of the gate electrode 2 and the gate connection portion has thereover a gate contact plug and a gate wiring (not illustrated) electrically coupled to the gate connection portion as in the semiconductor device of First Embodiment.

A difference between the semiconductor device of the present embodiment and the semiconductor device of First Embodiment is only the layout in the plane of the SOI substrate so that the semiconductor device of the present embodiment can be manufactured using almost similar manufacturing steps to those of First Embodiment.

In the present embodiment, advantages similar to those of First Embodiment can be achieved by coupling the well contact plug 8 penetrating through the hole portion to the p+ extraction region (not illustrated) in the surface of the SOI substrate to get the potential of a well and causing the element isolation region 4 to extend along the gate electrode 2 without interruption even below the gate electrode wiring 3. In addition, in the present embodiment, since two adjacent cells have, in common, the drain region, which has been formed in the SOI substrate below the drain wiring M1d, in the second direction, the element area in the second direction can be reduced, making it possible to miniaturize the semiconductor device including the semiconductor chip having an n channel MOSFET. More specifically, in the semiconductor device of the present embodiment, the length necessary for the formation of a cell in the second direction can be reduced to about two thirds of that in the semiconductor device of First Embodiment.

In the present embodiment, the above-description is made using the n channel MOSFET as an example, but the invention can be applied also to a p channel MOSFET. In the present embodiment, two adjacent cells have a drain region in common but the function of a drain may be reversed to that of a drain. Described specifically, in the present embodiment, a semiconductor region is formed in the order of source•drain•source between the two adjacent element isolation regions 4 in the surface of the SOI substrate. It is also possible to employ a structure in which semiconductor regions have been formed between two adjacent element isolation regions 4 in the order of drain•source•drain and two adjacent cells are caused to share a source region in common.

Third Embodiment

Figure 22:
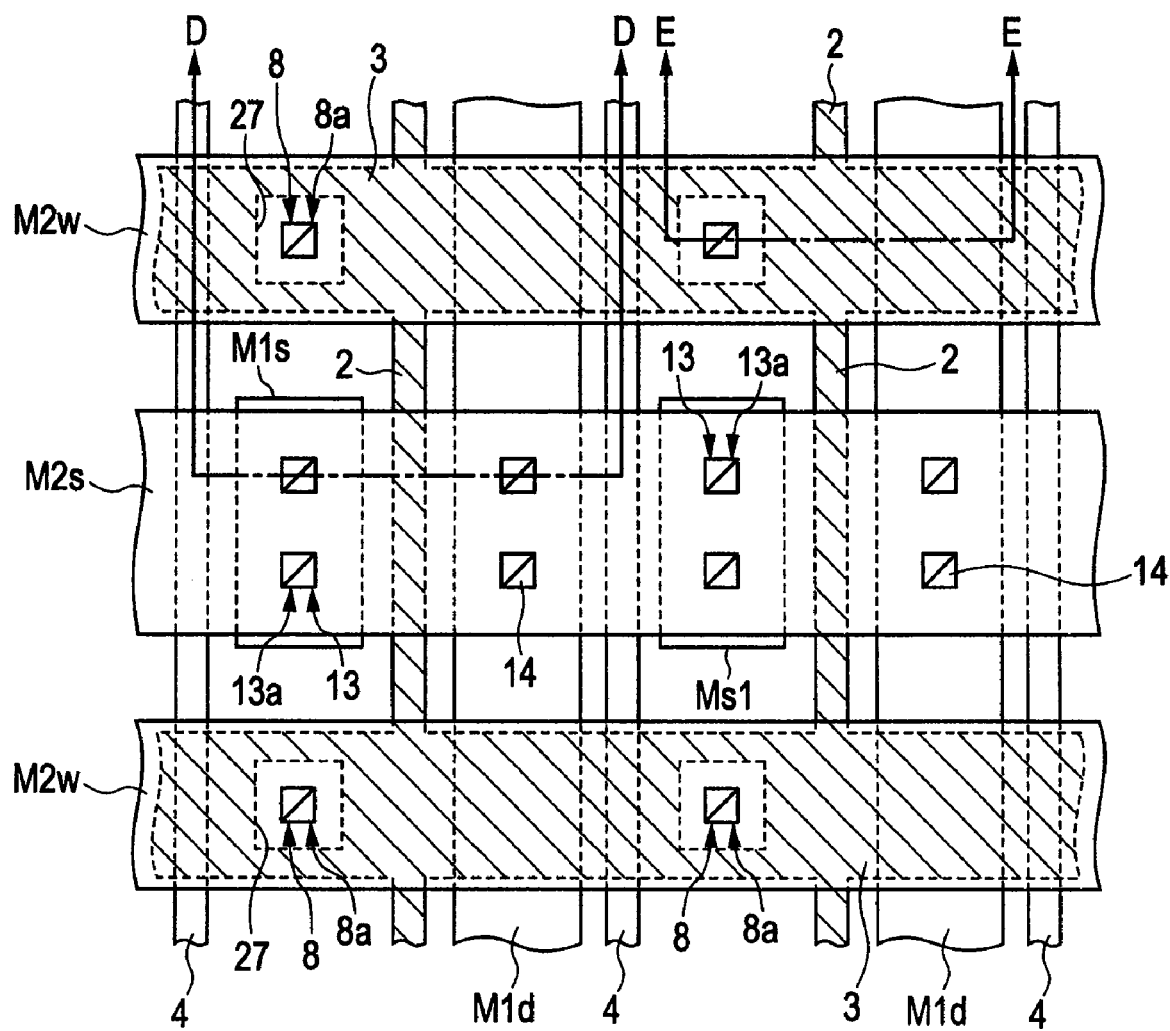
FIG. 22 is a planar layout of a semiconductor device according to Third Embodiment of the invention.
Figure 23:
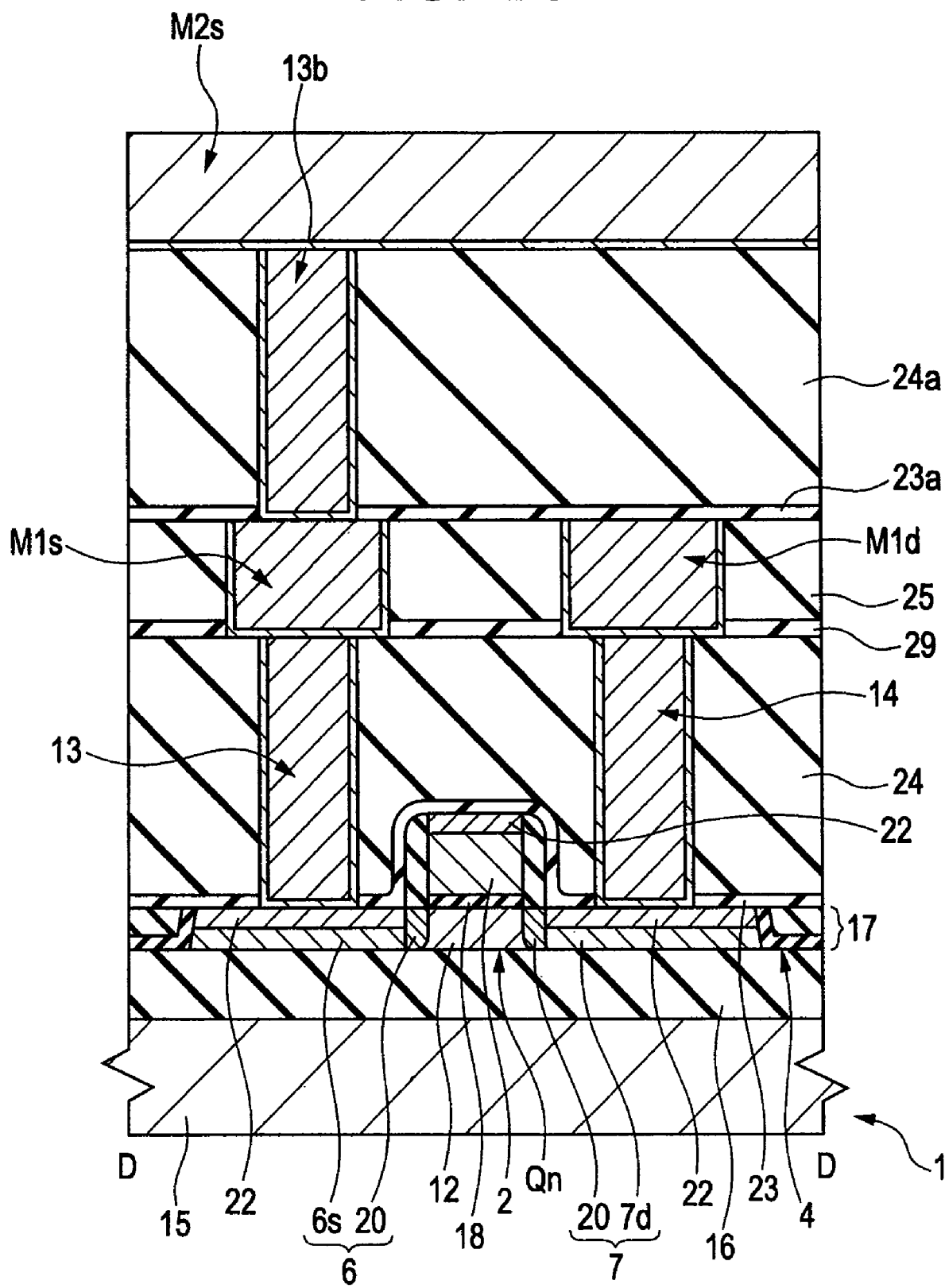
FIG. 23 is a fragmentary cross-sectional view taken along a line D-D of FIG. 22.
Figure 24:
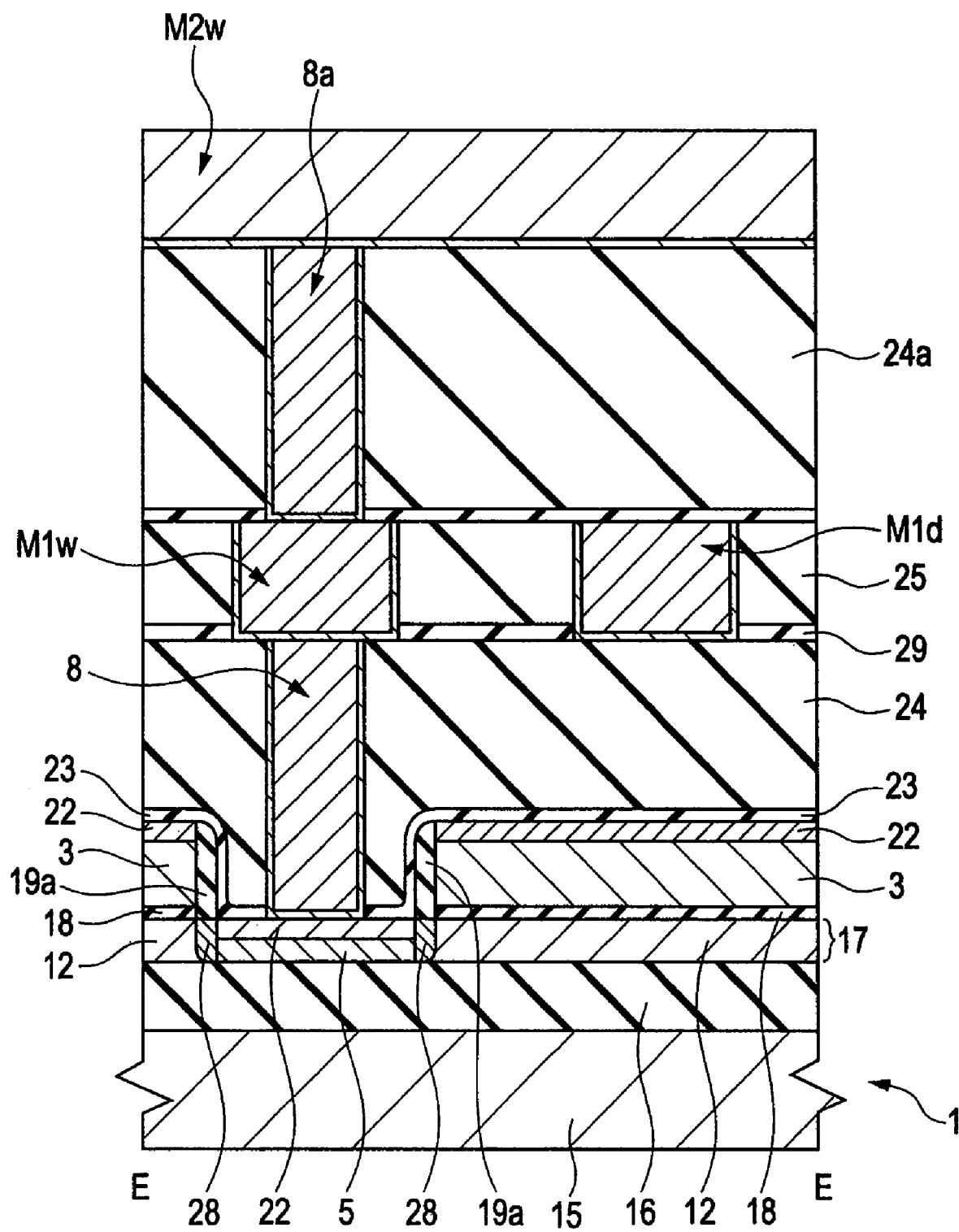
FIG. 24 is a fragmentary cross-sectional view taken along a line E-E of FIG. 22.

The semiconductor device described in the above First and Second Embodiments has a source tie structure in which a substrate potential has been coupled to a source. In the present embodiment, a semiconductor device having an n channel MOSFET and capable of controlling the potential of a source and that of a well independently and thereby improving the controllability of a potential will be described referring to FIG. 22 to FIG. 24. FIG. 22 is a planar layout of the semiconductor device according to the present embodiment. FIGS. 23 and 24 are fragmentary cross-sectional views taken along a line D-D and line E-E of FIG. 22, respectively. An SOI substrate is not illustrated in FIG. 22 and a source region a (refer to FIG. 23) formed below a source wiring M1s, a drain region (refer to FIG. 23) formed below a drain wiring M1d and a p− well 12 (refer to FIG. 23) formed below a gate electrode 2 are omitted from the drawing. In First and Second Embodiments, the SOI substrate 1 and the first-level wiring over the SOI substrate 1 are shown in FIGS. 1 to 5 and FIG. 21, while in the present embodiment, first-level and second-level wirings over the SOI substrate 1 are illustrated in FIGS. 22 to 24.

As illustrated in FIG. 22, the semiconductor device of the present embodiment has a gate electrode 2 extending in a first direction along the main surface of the SOI substrate 1 (refer to FIG. 23). The gate electrode 2 is coupled to a gate electrode wiring 3 which is formed in the same layer and extending in a second direction perpendicular to the first direction. The gate electrode wiring 3 has a hole portion 27 from which the upper surface of a $p^+$ extraction region 5 (refer to FIG. 24) is exposed and a well contact plug 8 penetrates through the hole portion 27. The gate electrode wiring 3 has thereover a source wiring M1s and a drain wiring M1d which are first-level wirings and extend in the first direction. Although not illustrated, the gate electrode wiring 3 has, at an end portion thereof, a gate connection portion for controlling the potential of the gate electrode 2 similar to that of the semiconductor device of First Embodiment illustrated in FIG. 1. The gate connection portion has thereover a gate contact plug and gate wiring (not illustrated) electrically coupled thereto. The source wiring M1s is not formed rightly above the gate electrode wiring 3 and is formed intermittently in the first direction. This means that the source wiring M1s does not planarily overlap with the gate electrode wiring 3. A plurality of n channel MOSFETs formed over the SOI substrate 1 (refer to FIG. 24) in the second direction has an element isolation region 4 between them and the element isolation region 4 is formed continuously in the first direction without interruption even below the gate electrode wiring 3.

As illustrated in FIG. 23, the source wiring M1s is electrically coupled to an $n^+$ semiconductor region 6s via a source contact plug 13 and the drain wiring M1d is electrically coupled to an $n^+$ semiconductor region 7d via a drain contact plug 14. The source wiring M1s and the drain wiring M1d have thereover a well wiring M2w and a source wiring M2s. The source wiring M2s is electrically coupled to the source wiring M1s via a source contact plug 13b. As illustrated in FIG. 24, the well wiring M2w is electrically coupled to the $p^+$ extraction region 5 via the well contact plug 8, a metal film M1w, and a well contact plug 8a. Incidentally, the metal film M1w and the well wiring M2w are metal wirings for supplying the $p^-$ well 12 with a predetermined potential and the metal film M1w are formed as the same layer as the source wiring M1s (not illustrated), the drain wiring M1d (not illustrated), and the gate wiring M1g (not illustrated).

As illustrated in FIGS. 23 and 24, the source wiring M1s, the drain wiring M1d, and the interlayer insulating film 25 have thereover an insulating film 23a; the insulating film 23a has thereover an interlayer insulating film 24a; and a source contact plug 13b and a well contact plug 8a, each penetrating through from the top surface of an interlayer insulating film 24a to the bottom surface of the insulating film 23a, are formed. The source contact plug 13b and the well contact plug 8a have thereover a source wiring M2s and a well wiring M2w, respectively. Although not illustrated, the interlayer insulating film 24a has thereover a stopper insulating film (not illustrated) and the stopper insulating film has thereover an interlayer insulating film (not illustrated). The source wiring M2s and the well wiring M2w are isolated from each other with the stopper insulating film and the interlayer insulating film. As illustrated in FIG. 24, the well contact plug 8 and the well contact plug 8a have therebetween the metal film M1w formed from the same layer as the source wiring M1s and the drain wiring M1d, but illustration of the metal film M1w is omitted from FIG. 22.

Incidentally, a difference between the semiconductor device of the present embodiment and the semiconductor device of First Embodiment is only the planar layout of an SOI substrate. The semiconductor device of the present embodiment can be manufactured using almost similar manufacturing steps to those of First Embodiment. The insulating film 23a, the interlayer insulating film 24a, the well contact plug 8a, and the source contact plug 13b shown in FIGS. 23 and 24 can be formed in a similar manner to that employed for the formation of the insulating film 23, the interlayer insulating film 24, the well contact plug 8, and the source contact plug 13 as described above referring to FIGS. 18 and 19 of First Embodiment. Similarly, the well wiring M2w and the source wiring M2s illustrated in FIGS. 23 and 24 can be formed in a similar manner to that employed for the formation of the source wiring M1s described above using FIG. 20 of First Embodiment.

As illustrated in FIG. 22, an advantage similar to that of First Embodiment can be achieved by coupling the well contact plug 8 passing through the hole portion 27 to a $p^+$ extraction region 5 (refer to FIG. 24) to get a potential of the well or by causing the element isolation region 4 to extend along the gate electrode 2 even below the gate electrode wiring 3 without interruption. The semiconductor device of the present embodiment has, similar to the semiconductor device of First Embodiment, no source region (or drain region) between two adjacent cells.

As illustrated in FIG. 22, in the present embodiment, the source wiring M1s and the source wiring M2s which are wirings coupled to the source region 6 (refer to FIG. 23) are isolated from the well wiring M2w coupled to the $p^+$ extraction region 5 (refer to FIG. 24) in order to control the potential of the well and they are not electrically coupled to each other. This means that the source wiring M1s and the source wiring M2s are isolated from the drain wiring M1d and the well wiring M2w, respectively, and the $p^-$ well 12 (refer to FIG. 23) and the source region 6 (refer to FIG. 23) are not electrically coupled to each other. Such a structure makes it possible to control the potential of the source and the potential of the well independently, making it possible to improve the controllability of the potential of the source and the well compared with the semiconductor devices of First and Second Embodiments and the semiconductor device of the comparative example shown in First Embodiment.

Fourth Embodiment

Figure 25:
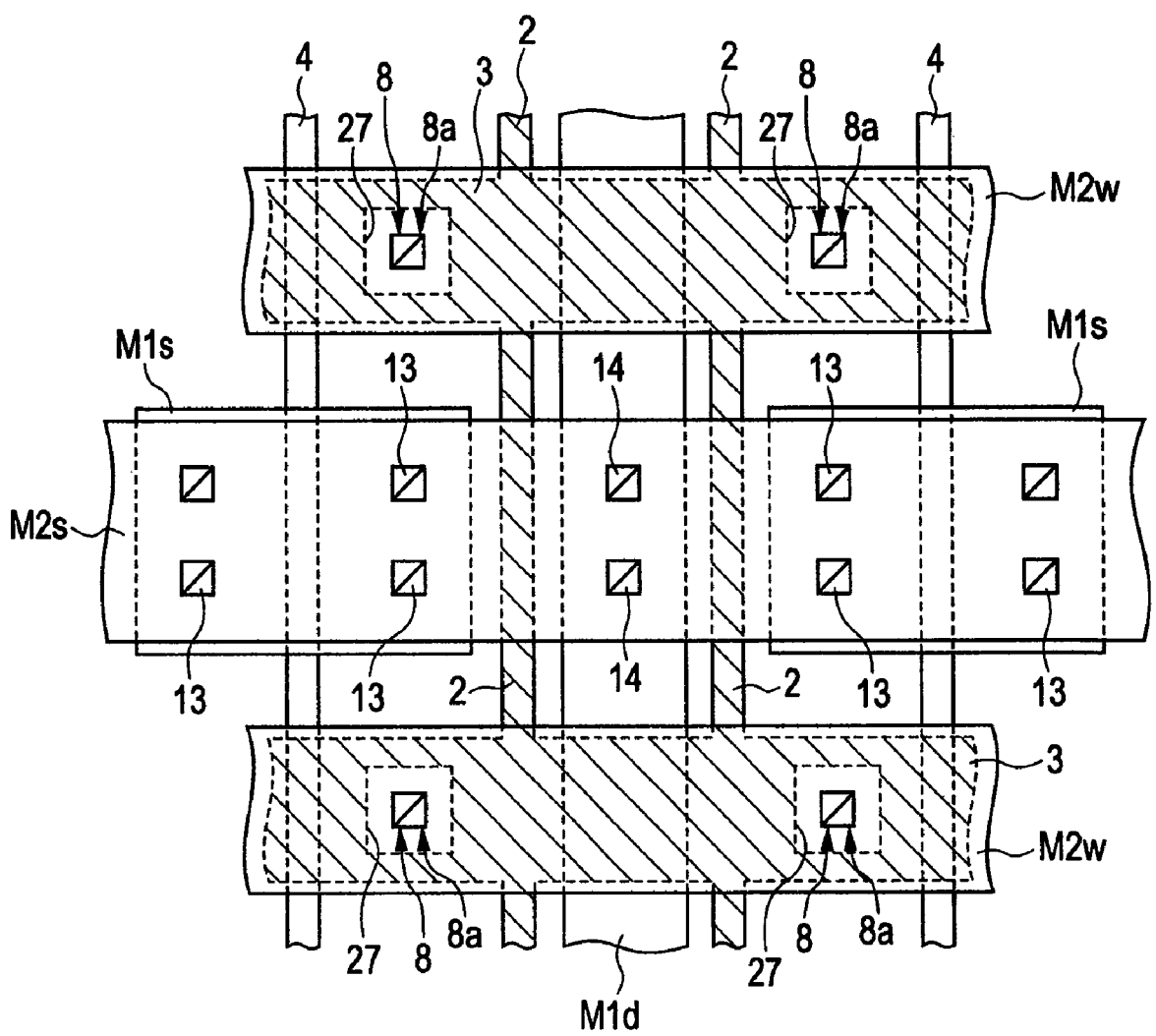
FIG. 25 is a planar layout of a semiconductor device according to Fourth Embodiment of the invention.

Next, a semiconductor device having a structure which enables independent potential control of a source and a well and has a source region in common between two adjacent cells will be described referring to FIG. 25. FIG. 25 is a planar layout of the semiconductor device of the present embodiment. An SOI substrate is not illustrated in this drawing in order to facilitate understanding of it.

The fundamental structure of the semiconductor device of the present embodiment is similar to that of Third Embodiment. As illustrated in FIG. 25, two element isolation regions 3 extending in a first direction and formed in parallel to each other in a second direction perpendicular to the first direction have, between them, two cells in the second direction. These two cells have a drain region (not illustrated) in common. The semiconductor device of the present embodiment has therefore a reduced element area in the second direction compared with the semiconductor device of Third Embodiment.

Incidentally, a difference between the semiconductor device of the present embodiment and the semiconductor device of Third Embodiment is only the planar layout of an SOI substrate. The semiconductor device of the present embodiment can therefore be manufactured through almost the same manufacturing steps as those of Third Embodiment.

In the present embodiment, advantages similar to those of Third Embodiment can be achieved by coupling the well contact plug 8 passing through the hole portion 27 to a $p^+$ extraction region (not illustrated) in the surface of the SOI substrate to get the potential of a well and causing an element isolation region 4 to extend along a gate electrode 2 without interruption even below a gate electrode wiring 3. In addition, in the present embodiment, since two adjacent cells have, in common, a drain region, which has been formed in the surface of the SOI substrate below the drain wiring M1d, in the second direction, the element area in the second direction can be reduced, making it possible to miniaturize the semiconductor device. More specifically, in the semiconductor device of the present embodiment, the length necessary for the formation of a cell in the second direction can be reduced to about two thirds of that in the semiconductor device of Third Embodiment.

Fifth Embodiment

Figure 26:
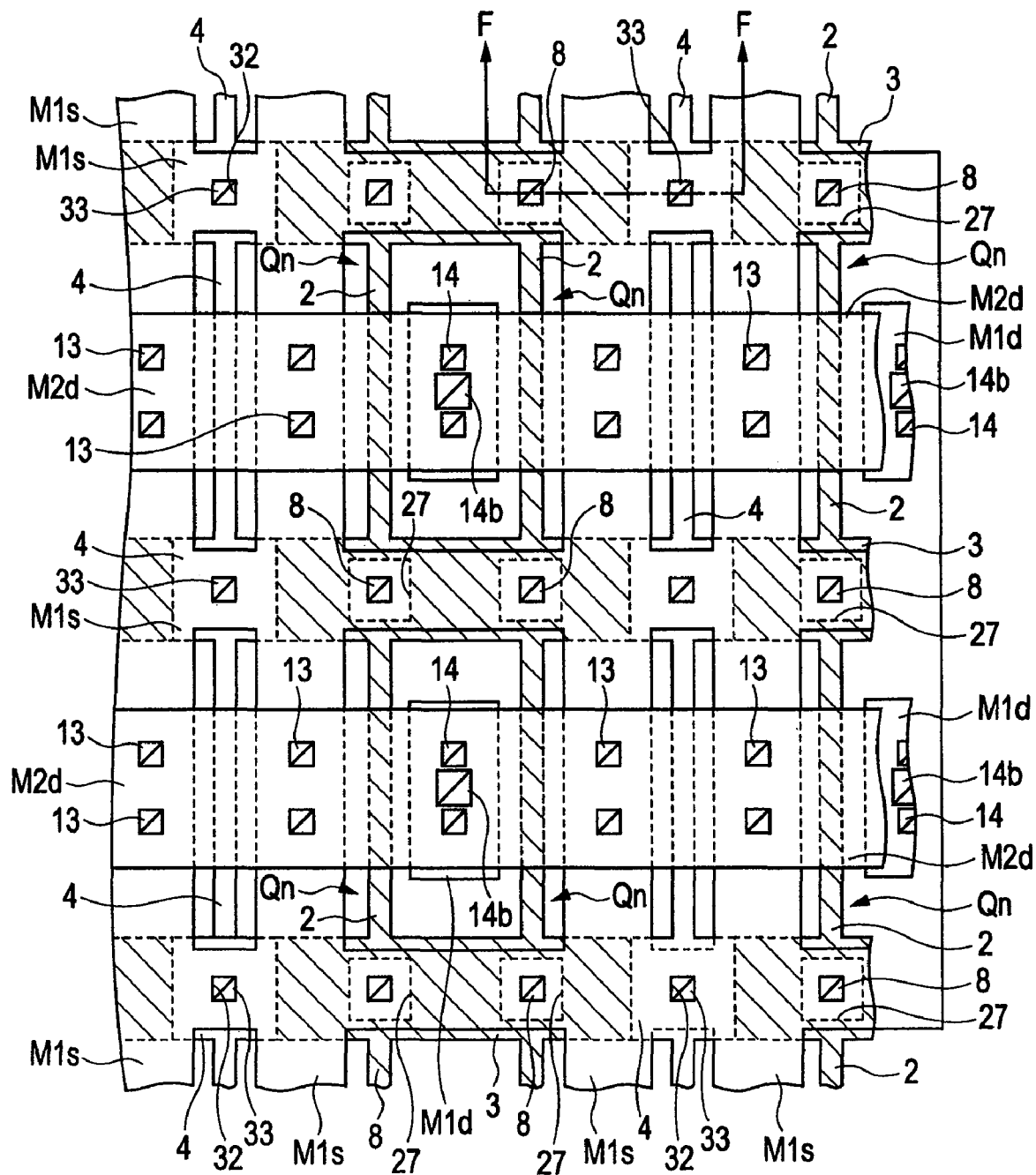
FIG. 26 is a planar layout of a semiconductor device according to Fifth Embodiment of the invention.
Figure 27:
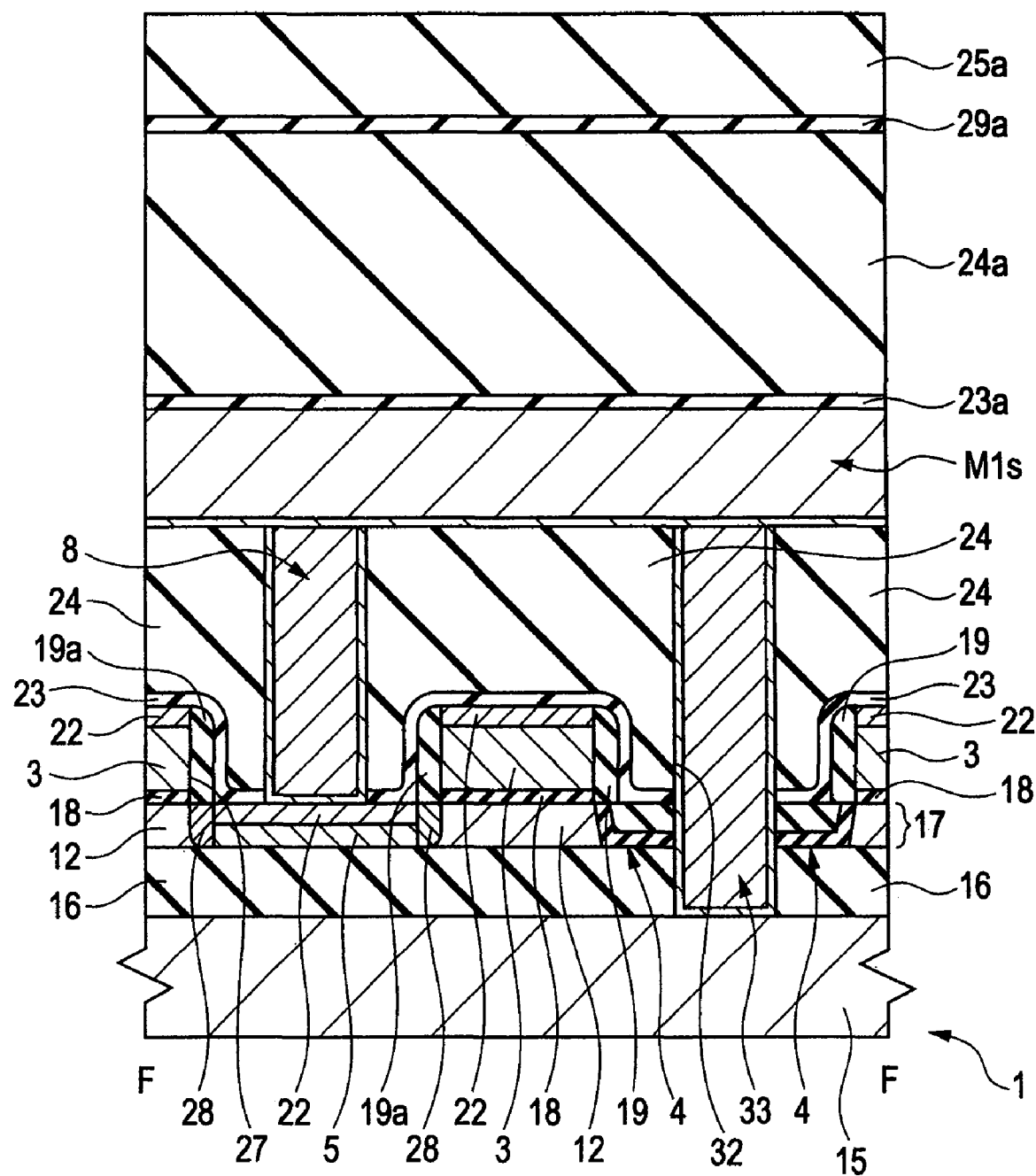
FIG. 27 is a fragmentary cross-sectional view taken along a line F-F of FIG. 26.

Next, a semiconductor device capable of controlling the potential of a well formed in a silicon layer 17 in the surface of an SOI substrate 1 and also the potential of a support substrate of the SOI substrate 1 will be described referring to FIGS. 26 and 27. FIG. 26 is a planar layout of an n channel MOSFET Qn formed over the SOI substrate 1 (refer to FIG. 27) and FIG. 27 is a fragmentary cross-sectional view taken along a line F-F of FIG. 26. FIG. 26 omits illustration of the SOI substrate to facilitate understanding of the drawing.

As illustrated in FIGS. 26 and 27, the semiconductor device of the present embodiment has an n channel MOSFET Qn formed over the SOI substrate 1 and a gate electrode 2, a source region 6 (not illustrated), a drain region 7 (not illustrated), and an element isolation region 4 of the n channel MOSFET Qn extend in a first direction along the main surface of the SOI substrate 1. The gate electrode 2 is formed in the same layer as the gate electrode 2 and is coupled to a plurality of gate electrode wirings 3 extending in a second direction, which is a direction along the main surface of the SOI substrate 1 and perpendicular to the first direction. Unlike First to Fourth Embodiments, the gate electrode wiring 3 is not formed over the element isolation region 4 formed over the main surface of the SOI substrate 1 but formed intermittently in the second direction. Unlike First Embodiment, the gate electrode 2 and the gate electrode wiring 3 are coupled to a gate wiring (not illustrated) at an end portion (not illustrated) of them in the first direction.

The gate electrode 2 has thereover a source wiring M1s and a drain wiring M1d and the source wiring M1s and the drain wiring M1d have thereover a drain wiring M2d extending in the second direction. The source wiring M1 is made of wirings extending in the first direction and the second direction in a lattice form (network form) and in the plane of the SOI substrate 1, the source wiring M1s, the gate electrode wiring 3 and the hole portion 27 formed in the gate electrode wiring 3 overlap with each other. The hole portion 27 is a hole starting from the top surface of the gate electrode wiring 3 and reaching the silicon layer 17. The silicon layer 17 below the hole portion 27 has a p$^+$ extraction region 5. The silicon layer 17 below the drain wiring M1d has a drain region 7. The drain wiring M1d and the drain region 7 are electrically coupled to each other via the drain contact plug 14. Similarly, the silicon layer 17 below the source wiring M1s extending in the first direction has a source region 6 and the source wiring M1s and the source region 6 are electrically coupled to each other via the source contact plug 13. In addition, the drain wiring M1d and the drain wiring M2d are electrically coupled to each other via the drain contact plug 14b.

In this embodiment, the element isolation region 4 in a region between two gate electrode wirings 3 adjacent to each other in the second direction has a longer width than the second-direction width of the element isolation region 4 of the other region and the gate electrode wirings 3 adjacent to each other in the second direction have therebetween a hole portion 32 penetrating through from the top surface to the bottom surface of the element isolation region 4. As illustrated in FIG. 27, the hole portion 32 starts from the top surface of the element isolation region 4 and reaches the top surface of the support substrate 15 configuring the SOI substrate 1 and the hole portion 32 has therein a contact plug 33 for coupling the bottom surface of the source wiring M1s to the top surface of the support substrate 15. Via the contact plug 33, the source wiring M1s formed over the element isolation region 4 is electrically coupled to the support substrate 15. In addition, via the well contact plug 8 passing through the hole portion 27 formed in the gate electrode wiring 3, the source wiring M1s and the p$^-$ well 12 are electrically coupled to each other.

Accordingly, in the semiconductor device of the present embodiment, the potential of the p$^-$ well 12 and the support substrate 15 can be controlled. In First to Fourth Embodiments described above, generation of a parasitic capacitance can be suppressed by controlling the potential of the p$^-$ well 12. In the semiconductor device of the present embodiment, on the other hand, the semiconductor device having improved reliability is obtained by controlling the potential of the support substrate 15, thereby further reducing generation of a parasitic capacitance in the n channel MOSFET Qn illustrated in FIG. 26.

Incidentally, the p$^-$ well 12, the support substrate 15, and the source region 6 have the same potential because all of the p$^-$ well 12, the support substrate 15, and the source region 6 are coupled to the source wiring M1s. In the present embodiment, similar to First to Fourth Embodiments described above, due to a gettering effect of the element isolation region 4 extending along the second direction, defects generated in the main surface of the SOI substrate 1 can be collected in the element isolation region 4. As a result, a semiconductor device having improved reliability can be obtained.

Further, in the present embodiment, the n channel MOSFET Qns of two cells between two adjacent element isolation regions 4 have the drain region 7 in common so that the element area in the second direction can be reduced compared with that of the semiconductor device of First Embodiment.

The semiconductor device of the present embodiment is different from that of Third. Embodiment in the planar layout of the SOI substrate. In addition, they are different in that the element isolation region 4 has therein the hole portion 32 and via the contact plug 33 formed in the hole portion 32, the support substrate 15 is coupled to the source wiring M1s. Incidentally, the stopper insulating film 29a and the interlayer insulating film 25a illustrated in FIG. 27 can be formed in a similar manner to that employed for the formation of the stopper insulating film 29 and the interlayer insulating film 25 described above referring to FIG. 20 of First Embodiment. With regard to the formation of the contact plug 33, after formation of the contact plug 26 but before embedding of the contact hole 26 with a metal such as W (tungsten) in the step described in First Embodiment referring to FIG. 19, a contact hole reaching the top surface of the support substrate 15 may be formed using photolithography and dry etching.

Sixth Embodiment

Figure 28:
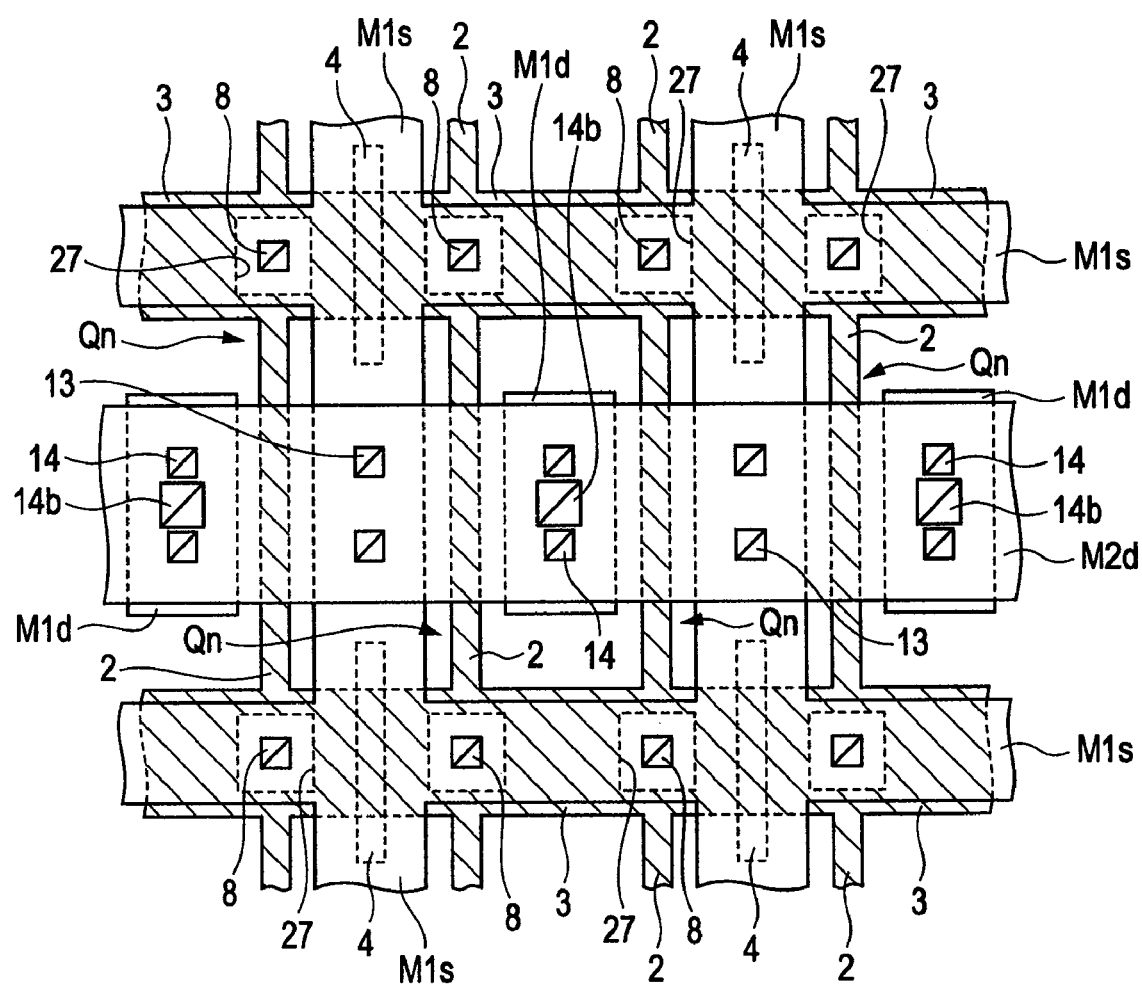
FIG. 28 is a planar layout of a semiconductor device according to Embodiment 6 of the invention.

Next, a semiconductor device having a smaller element area than the semiconductor devices of First to Fifth Embodiments will be described referring to FIG. 28. FIG. 28 is a planar layout of an n channel MOSFET Qn formed over an SOI substrate (not illustrated). The SOI substrate is not illustrated in FIG. 28 to facilitate understanding of it.

As illustrated in FIG. 28, the semiconductor device of the present embodiment has an n channel MOSFET Qn formed over the SOI substrate (not illustrated) and a gate electrode 2, a source region (not illustrated), a drain region (not illustrated), and an element isolation region 4 of the n channel MOSFET Qn extend in a first direction along the main surface of the SOI substrate. The gate electrode 2 is formed in the same layer as the gate electrode 2 is coupled to a plurality of gate electrode wirings 3 extending in a second direction which is a direction along the main surface of the SOI substrate and perpendicular to the first direction. Unlike First to Fourth Embodiments, however, the element isolation region 4 is interrupted in a region between two adjacent gate electrodes 2 and is formed intermittently along the second direction.

The gate electrode 2 has thereover a source wiring M1$s$ and a drain wiring M1$d$, and the source wiring M1$s$ and the drain wiring M1$d$ have thereover a drain wiring M2$d$. The source wiring M1$s$ is made of wirings extending in the first direction and the second direction in a lattice form (network form) and in the plane of the SOI substrate, the source wiring M1$s$, the gate electrode wiring 3, and the hole portion 27 formed in the gate electrode wiring 3 overlap with each other. The hole portion 27 is a hole starting from the top surface of the gate electrode wiring 3 and reaching a silicon layer 17 (not illustrated). The silicon layer 17 below the hole portion 27 has a p$^+$ extraction region 5 (not illustrated). The silicon layer 17 below the drain wiring M1$d$ has a drain region 7 (not illustrated). The drain wiring M1$d$ and the drain region 7 are electrically coupled to each other via a drain contact plug 14. Similarly, the silicon layer 17 below a source wiring M1$s$ extending in the first direction has a source region 6 (not illustrated), and the source wiring M1$s$ and the source region 6 are electrically coupled to each other via the source contact plug 13. In addition, the drain wiring M1$d$ and the drain wiring M2$d$ are electrically coupled to each other via the source contact plug 13$b$.

A difference between the semiconductor device of the present embodiment and that of Third Embodiment is only the planar layout of an SOI substrate. The semiconductor device of the present embodiment can be manufactured through almost similar manufacturing steps to those of Third Embodiment.

In the present embodiment, the potential of a well below the gate electrode 2 can be controlled by using the well contact plug 8 passing through the hole portion 27 formed in the gate electrode wiring 3. This makes it possible to reduce the parasitic capacitance generated in the MOSFET.

Incidentally, in the present embodiment, unlike First to Fifth Embodiments, the element isolation region 4 is formed below the source wiring M1$s$ extending in the second direction, and the element isolation region 4 and the source wiring M1$s$ extending in the second direction overlap with each other in the plane of the SOI substrate (not illustrated). The element isolation region 4 is interrupted at below the drain wiring M2$d$ and is formed intermittently in the first direction. Even in such a structure, it is possible to prevent occurrence of defects in the n channel MOSFET Qn due to a gettering effect of the element isolation region 4 extending in the first direction without being interrupted below the gate electrode wiring 3. Also in this embodiment, the element isolation region 4 extending in the first direction is located below the gate electrode wiring 3 extending in the second direction. In the first direction, the element isolation region 4 is protruded from both end portions of the gate electrode wiring 3. In other words, in the gate electrode wiring 3 extending in the second direction, both end portions in the first direction are provided over the element isolation region 4.

As illustrated in FIG. 28, the element isolation region 4 is terminated in contact with a source region (not illustrated) and is formed intermittently along the first direction. The element isolation regions 4 in the first direction have, over the source region therebetween, a source contact plug 13 electrically coupled to the source region 6. This means that the source contact plug 13 does not planarly overlap with the element isolation region 4. When the element isolation regions 3 are formed continuously so as to divide the source region 6, it is impossible to allow the n channel MOSFET Qns adjacent to each other in the second direction to have the source region 6 in common and to reduce an element area. Accordingly, in the present embodiment, the source region 6 is provided between the two element isolation regions 4 formed intermittently in the first direction to enable sharing of the source region 6 by the two n channel MOSFET Qns adjacent to each other in the second direction.

In the present embodiment, unlike First to Fifth Embodiments, two cells adjacent to each other in the second direction have at least either one of the source or drain in common, and the source region and the drain region adjacent to each other in the second direction have a gate electrode 2 in a region therebetween. This means that the source and drain are arranged alternately in the second direction, and a gate electrode 2 is formed in a region between the source and the drain adjacent to each other. Since the cells adjacent to each other have a source or a drain in common, the element area in the second direction can be reduced compared with that of any of the semiconductor devices described above in First to Fifth Embodiments.

More specifically, in the semiconductor device of the present embodiment, a length necessary for forming one cell in the second direction can be reduced to about half of that of the semiconductor device of First or Third Embodiment in which two cells adjacent to each other in the second direction have neither cell nor drain in common. In addition, in the semiconductor device of the present embodiment, a length necessary for forming one cell in the second direction can be reduced to from about three fourths to four fifths of that of the semiconductor devices of Second, Fourth, and Fifth Embodiments in which two cells adjacent to each other in the second direction have either one of the source or drain in common. Thus, in the semiconductor device of the present embodiment, the area (chip size) of a semiconductor chip including the n channel MOSFET can be made smaller than that of the semiconductor device of First or Third Embodiment.

As described above, in the present embodiment, it is possible to obtain a semiconductor device having improved reliability by controlling the potential of a well as in First Embodiment to prevent generation of a parasitic capacitance and suppressing generation of defects by making use of a gettering effect produced by the element isolation region 4.

The inventions made by the present inventors have been described specifically based on some embodiments. It is needless to say that the inventions are not limited to or by the embodiments but can be changed without departing from the scope of the invention.

The present invention is widely utilized in semiconductor devices having a semiconductor element formed over an SOI substrate.

What is claimed is:

1. A semiconductor device comprising a field effect transistor over a main surface of a semiconductor substrate having an SOI structure, the semiconductor device comprising:
    a well region of a first conductivity type formed over the main surface of the semiconductor substrate and extending in a first direction along the main surface of the semiconductor substrate;
    a gate electrode formed over the well region via an insulating film and extending in the first direction;
    source and drain regions of a second conductivity type formed in the main surface of the semiconductor substrate along the first direction to sandwich the well region;
    a gate wiring formed over the semiconductor substrate in the same layer as the gate electrode and integrated with the gate electrode;
    a coupling layer of the first conductivity type formed in the well region in a region overlapping with the gate wiring in a plane of the semiconductor substrate, electrically coupled to the well region, and having a low resistance than the well region; and
    a first wiring formed above the gate electrode and the gate wiring and supplying a predetermined potential to the well region,
    wherein the coupling layer and the first wiring are provided in a first hole portion formed in the gate wiring in a region where the coupling layer and the semiconductor substrate planarly overlap with each other and are electrically coupled with each other via a coupling member insulated from the gate wiring.

2. The semiconductor device according to claim 1, wherein the gate wiring extends in a second direction which is a direction along the main surface of the semiconductor substrate and is perpendicular to the first direction.

3. The semiconductor device according to claim 1, wherein one of the source region and the drain region is coupled to the first wiring via a second coupling member formed over the either one of the source region or the drain region, and the well region is electrically coupled to the one of the source region and the drain region formed below the second coupling member via the coupling layer, the first coupling member, the first wiring, and the second coupling member.

4. The semiconductor device according to claim 1, further comprising second and third wirings formed in the same layer as the first wiring,
    wherein the source region and the drain region are electrically coupled to the second and third wirings, respectively,
    wherein the first, the second, and third wirings are insulated from each other, and
    wherein the well region is not electrically coupled to the source region and the drain region.

5. The semiconductor device according to claim 1, wherein the coupling layer comprises an extraction region of the first conductivity type which has a lower resistance than the well region and a semiconductor region of the first conductivity type formed between the extraction region and the well region and having a lower resistance than the well region and a higher resistance than the extraction region.

6. The semiconductor device according to claim 1, wherein the first conductivity type impurity introduced into the coupling layer and the second conductivity type impurity of the source region or the drain region are not introduced into the same region.

7. The semiconductor device according to claim 1, wherein the semiconductor substrate has, over the main surface thereof, a plurality of the field effect transistors, and the field effect transistors adjacent to each other in a second direction which is a direction along the main surface of the semiconductor substrate and is perpendicular to the first direction have the source region or the drain region in common.

8. The semiconductor device according to claim 7, wherein the source regions or the drain regions formed intermittently in the first direction have therebetween an element isolation region having a first-direction length longer than the first-direction width of the gate wiring and extending along the first direction in the main surface of the semiconductor substrate.

9. The semiconductor device according to claim 8, wherein the element isolation region is formed continuously in the first direction without being divided below the gate wiring.

10. The semiconductor device according to claim 8,
    wherein the element isolation region is brought into contact with the source region or the drain region to terminate thereat and is formed intermittently along the first direction, and
    wherein a second coupling member is formed over the source region or the drain region between the element isolation regions in the first direction.

11. The semiconductor device according to claim 1,
    wherein between a plurality of the field effect transistors formed intermittently in the main surface of the semiconductor substrate in a second direction, which is a direction along the main surface of the semiconductor substrate and is perpendicular to the first direction, an element isolation region is formed in the main surface of the semiconductor substrate along the first direction.

12. The semiconductor device according to claim 11, wherein the element isolation region is continuous in the first direction without being divided below the gate wiring.

13. The semiconductor device according to claim 11,
    wherein the element isolation region has a second hole portion penetrating through a top surface to a bottom surface of the element isolation region,
    wherein the second hole portion reaches a top surface of a support substrate formed below the element isolation region and configuring the semiconductor substrate,
    wherein the second hole portion has therein a fourth coupling member coupled to a fourth wiring formed above the element isolation region, and
    wherein the support substrate and the fourth wiring are electrically coupled to each other via the fourth coupling member.

14. The semiconductor device according to claim 1, further comprising an element isolation region formed in the semiconductor substrate and extending in the first direction,
    wherein the element isolation region is a region obtained by filling an insulating film in a trench formed in the semiconductor substrate, and
    wherein the gate wiring has, at both end portions thereof, the element isolation region in the first direction.

15. The semiconductor device according to claim 14,
    wherein the element isolation region has a second hole portion penetrating through a top surface to a bottom surface of the element isolation region,
    wherein the second hole portion reaches a top surface of a support substrate formed below the element isolation region and configuring the semiconductor substrate,
    wherein the second hole portion has therein a fourth coupling member coupled to a fourth wiring formed over the element isolation region, and
    wherein the support substrate and the fourth wiring are electrically coupled to each other via the fourth coupling member.

* * * * *